(12) United States Patent
Ko et al.

(10) Patent No.: US 9,922,591 B2
(45) Date of Patent: Mar. 20, 2018

(54) DISPLAY DRIVING METHOD AND MOBILE APPARATUS THEREOF

(71) Applicant: AU Optronics Corporation, Hsin-Chu (TW)

(72) Inventors: Chien-Chuan Ko, Hsin-Chu (TW); Chun-Hung Kuo, Hsin-Chu (TW); Meng-Chieh Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/357,331

(22) Filed: Nov. 21, 2016

(65) Prior Publication Data
US 2017/0154567 A1 Jun. 1, 2017

(30) Foreign Application Priority Data

Nov. 27, 2015 (TW) .............................. 104139689 A

(51) Int. Cl.
*G09G 3/20* (2006.01)
*G11C 19/28* (2006.01)
(Continued)

(52) U.S. Cl.
CPC ........... *G09G 3/2092* (2013.01); *G06F 3/044* (2013.01); *G06F 3/0412* (2013.01);
(Continued)

(58) Field of Classification Search
CPC ......... G09G 3/2092; G09G 2310/0286; G09G 2310/08; G09G 2300/0809; G06F 3/0416; G06F 3/044; G06F 3/0412; G11C 19/28
See application file for complete search history.

(56) References Cited

U.S. PATENT DOCUMENTS

| 6,653,993 B1 * | 11/2003 | Nagao | ................. | G09G 3/2927 345/60 |
| 7,948,463 B2 * | 5/2011 | Kitayama | ............ | G09G 3/3648 345/208 |

(Continued)

FOREIGN PATENT DOCUMENTS

| CN | 203982752 U | 12/2014 |
| TW | 2014235523 A | 6/2014 |

OTHER PUBLICATIONS

Taiwan Intellectual Property Office, "Office Action", dated Dec. 14, 2016.

*Primary Examiner* — Andrew Sasinowski
(74) *Attorney, Agent, or Firm* — WPAT, PC

(57) ABSTRACT

A display driving method includes: performing a display scan function and a display stop function during a plurality of frame periods; during one frame period, outputting, alternately and sequentially along a scan direction, N scan signals according to K clock signals when performing the display scan function, wherein each of the scan signals has an enable period of a scan line, the clock signals sequentially have a delay, and each of the clock signals is a periodic signal with K delays as one period; providing a driving control signal and disabling the clock signals when performing the display stop function during a display stop period, wherein an initiation time position of the display stop period is changed based on an offset between two neighboring frame periods, and the neighboring frame periods have no overlapping or interlacing interval.

25 Claims, 21 Drawing Sheets

(51) Int. Cl.
*G06F 3/041* (2006.01)
*G06F 3/044* (2006.01)

(52) U.S. Cl.
CPC ............ *G06F 3/0416* (2013.01); *G11C 19/28* (2013.01); *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 8,866,783 B2 | 10/2014 | Saitoh et al. | |
| 2001/0035849 A1* | 11/2001 | Kimura | G09G 3/2022 345/76 |
| 2007/0063991 A1* | 3/2007 | Lee | G06F 1/3203 345/173 |
| 2008/0218489 A1* | 9/2008 | Park | G06F 3/0416 345/173 |
| 2013/0314361 A1* | 11/2013 | Saitoh | G06F 3/0412 345/173 |
| 2014/0160067 A1* | 6/2014 | Kim | G06F 3/0416 345/174 |
| 2015/0213757 A1* | 7/2015 | Takahama | G09G 3/3266 345/691 |

\* cited by examiner

US 9,922,591 B2

DISPLAY DRIVING METHOD AND MOBILE APPARATUS THEREOF

TECHNICAL FIELD

The present disclosure relates to a display scanning method, and in particular, to a display scanning method having a display stop period in a frame period.

BACKGROUND ART

Recently, various LCD products have become popular for use in mobile hand-held devices. In addition, due to widespread use of smart end devices, integration of a touch function into smart end devices has become a mainstream demand for current products.

A frame period of a conventional mobile apparatus includes a display scanning period and a touch sensing period, such that scan signals G(1)-G(N) are outputted during the display scanning period to drive scan lines of a display panel, and then sensing signals S(1)-S(N) are outputted during the touch sensing period to drive sensing lines of a touch panel. The display scanning period may include a plurality of enable periods of scan lines, and a time interval between neighboring enable periods of the scan lines is a display stop period, during which display scanning is suspended to perform touch sensing, and thus no scan signals is outputted to the mobile apparatus. FIG. 1 is a schematic circuit diagram of a shift register circuit 100 in a single-phase shift register. An $n^{th}$-stage shift register circuit 100 has a driving unit 110, a pull-up unit 120, a pull-down unit 130, and a pull-down control unit 140, wherein the pull-up unit 120 is conducted according to the previous-stage scan signal (e.g., the scan signal G(n−1)) to raise the voltage at a driving node Q to a high voltage level, and the driving unit 110 is conducted according to clock signals CK1/XCK1 to output the scan signal G(n).

FIG. 2 is a schematic waveform diagram of internal nodes and scan signals of the shift register circuit 100. During one frame period, after the scan signal G(n) is outputted, a display stop period begins. During the display stop period, the signals provided by a timing controller 300, such as the clock signals CK1/XCK1, are disabled to suspend outputting a scan signal G(n+1). Since the clock signals CK1/XCK1 are disabled, the driving units 110 of the $n^{th}$-stage and the $(n+1)^{th}$-stage shift register circuits 100 are in a cut-off state. However, the pull-up units 120 of the $n^{th}$-stage and the $(n+1)^{th}$-stage shift register circuits 100 has received the previous-stage scan signals, such that the voltages of the driving nodes Q of the $n^{th}$-stage and the $(n+1)^{th}$-stage shift register circuits 100 are maintained at a high voltage level, and thus causing transistors of the driving units 110 to be stressed due to bias voltages continuously acting on the driving units 110. Long time stressing reduces the reliability of the driving units 110, such that the scan signal G(n) is not outputted at a desired voltage level, thereby degrading display quality.

Thus, how to prevent the driving transistor of the shift register circuits from being stressed for a long time, resulting in component performance deterioration and thus erroneous output is one of the important development issues today, and also has become an object urgently in need of improvement in related fields today.

SUMMARY

One embodiment of the present disclosure provides a mobile apparatus, and the mobile apparatus includes: a display panel having N scan lines; a timing controller configured to output K clock signals and a driving control signal, to output a plurality of images respectively during a plurality of consecutive frame periods, and to display the images during enable periods of the scan lines, wherein the frame periods respectively comprise at least one sub-frame period including N enable periods of the scan lines and a display stop period, wherein the display stop period is between two neighboring enable periods of the scan lines, the display stop period and the enable periods of the scan lines have no overlapping interval, the clock signals sequentially have a delay, and each of the clock signals is a periodic signal with K delays as one period, and the timing controller being configured to output the driving control signal and the clock signals during the display stop period of the sub-frame period of each of the frame periods; determine the display stop period of the sub-frame period of a first frame period to occur between an enable period of an $n^{th}$ scan line and an enable period of an $(n+1)^{th}$ scan line; and determine the display stop period of the sub-frame period of a $Z^{th}$ frame period to occur between an enable period of an $(n+Z \times K)^{th}$ scan line and an enable period of an $(n+Z \times K+1)^{th}$ scan line, wherein the frame periods do not overlap with each other, and the $(n+Z \times K)^{th}$ scan line and the $(n+Z \times K+1)^{th}$ scan line are disposed next to each other, Z is an integer, n, N, and K are positive integers, n is smaller than N, N is greater than K, and $(n+Z \times K+1)$ is not greater than N; a scan driver electrically connected to the display panel and the timing controller and configured to receive the driving control signal and the clock signals, wherein a plurality of scan signals are sequentially outputted according to the clock signals during the enable periods of the scan lines, and driving of the scan driver is stopped during the display stop period, wherein the enable periods of the scan lines have no overlapping interval.

One embodiment of the present disclosure provides a driving method for scan signals, for sequentially outputting a plurality of scan signals respectively during a plurality of enable periods of scan lines in a plurality of consecutive frame periods, the method comprising: alternately and sequentially providing, during each of the frame periods, K clock signals, and sequentially enabling, during the enable periods of the scan lines, the scan signals according to the clock signals, wherein the clock signals sequentially have a delay, and each of the clock signals is a periodic signal with K delays as one period; including, in each of the frame periods, a sub-frame period comprising the enable periods of N scan lines and a display stop period, wherein the scan signals are not outputted during the display stop period, and the display stop period occurs between two neighboring enable periods of the scan lines, and the display stop period and the enable periods of the scan lines have no overlapping interval; the display stop period occurring between an enable period of an $n^{th}$ scan line and an enable period of an $(n+1)^{th}$ scan line during the sub-frame period of a first frame period; and during the sub-frame period of a $Z^{th}$ frame period, the display stop period occurring between an enable period of an $(n+Z \times K)^{th}$ scan line and an enable period of an $(n+Z \times K+1)^{th}$ scan line, wherein the frame periods do not overlap with each other, Z is an integer, n, N, and K are positive integers, n is smaller than N, N is greater than K, and $(n+Z \times K+1)$ is not greater than N.

One embodiment of the present disclosure provides a driving method for scan signals, for sequentially outputting N scan signals to N scan lines during the enable periods of N scan line in a plurality of consecutive frame periods, the method comprising: alternately and sequentially providing, during each of the frame periods, K clock signals, and sequentially enabling, during the enable periods of the scan lines, the scan signals according to the clock signals, wherein the clock signals sequentially have a delay, and each of the clock signals is a periodic signal with K delays as one period; including a display stop period of each of the frame periods and the display stop period occurring between two neighboring enable periods of the scan lines, wherein the providing of the clock signals is stopped during the display stop period to not enable the scan signals, and the display stop period and the enable periods of the scan lines have no overlapping interval; the display stop period of a first frame period occurring between an enable period of an $n^{th}$ scan line and an enable period of an $(n+1)^{th}$ scan line, wherein the $n^{th}$ scan line and the $(n+1)^{th}$ scan line are disposed next to each other; and the display stop period of a $Z^{th}$ frame period occurring between an enable period of an $(n+Z \times K)^{th}$ scan line and an enable period of an $(n+Z \times K+1)^{th}$ scan line, wherein the $(n+Z \times K)^{th}$ scan line and the $(n+Z \times K+1)^{th}$ scan line are disposed next to each other, the frame periods have no overlapping or interlacing intervals, Z is an integer, n, N, and K are positive integers, n is smaller than N, N is greater than K, and $(n+Z \times K+1)$ is not greater than N.

One embodiment of the present disclosure provides a driving method for scan signals, and the driving method comprises: alternately and sequentially providing, according to K clock signals, N scan signals to N scan lines during a plurality of consecutive frame periods, and enabling a drive control signal to implement a display stop period, wherein the clock signals sequentially have a delay, and each of the clock signals is a periodic signal with K delays as one period; during a first frame period, enabling the clock signals, and sequentially enabling, according to the clock signals, a first scan signal to an $n^{th}$ scan signal; enabling a driving control signal and disabling the clock signals to implement a display stop period; and after the display stop period, disabling the driving control signal and enabling the clock signals, and sequentially enabling, according to the clock signals, an $(n+1)^{th}$ scan signal to an $N^{th}$ scan signal; and during a $Z^{th}$ frame period, sequentially enabling, according to the clock signals, a first scan signal to an $(n+Z \times K)^{th}$ scan signal; enabling the driving control signal and disabling the clock signals to perform the display stop period; and after the display stop period, disabling the driving control signal and enabling the clock signals, and sequentially enabling a $(n+Z \times K+1)^{th}$ scan signal to an $N^{th}$ scan signal according to the clock signals, wherein the frame periods have no overlapping or interlacing intervals, Z is an integer, n, N, and K are positive integers, n is less than N, N is greater than K, and $(n+Z \times K+1)$ is not greater than N.

One embodiment of the present disclosure provides a display driving method, comprising: performing a display scan function and a display stop function respectively during a plurality of consecutive frame periods; during one of the frame periods, providing K clock signals to the scan driver and outputting, alternately and sequentially along a scan direction, N scan signals to N scan lines according to the clock signals when performing the display scan function, wherein each of the scan signals has an enable period of a scan line, the clock signals sequentially have a delay, and each of the clock signals is a periodic signal with K delays as one period; providing a driving control signal and disabling the clock signals when performing the display stop function during a display stop period, wherein an initiation time position of the display stop period is changed based on an offset between two neighboring frame periods, and each of the frame periods have no overlapping or interlacing interval with each other, n, N, and K are positive integers, n is less than N, and N is greater than K.

To sum up, according to various embodiments of the technical solution of the present disclosure, when a mobile apparatus receives an instruction to disable the clock signals, a display stop period begins and no scan signal is outputted to the display panel. The time positions of the display stop periods are moved, with the number of the clock signals as a unit, periodically for the plurality of frames period, so as to avoid stressing the driving elements of the scan driver for a long time that consequently reduces reliability of the driving elements, thereby improving the display quality.

The above description of the content of the present invention and the following illustration of the embodiments are intended to demonstrate and explain the spirit and principle of the present invention and to provide further explanations of the claims of the present invention.

BRIEF DESCRIPTIONS OF THE DRAWINGS

DETAILED DESCRIPTIONS OF THE INVENTION

Figure 1:
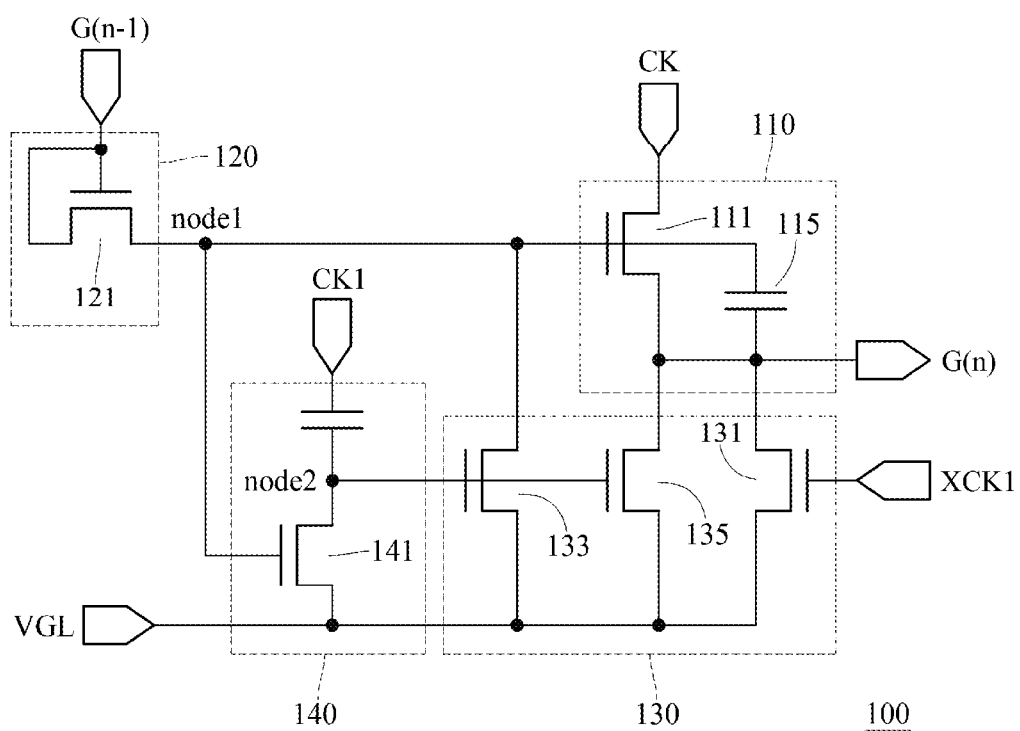
FIG. 1 is a schematic circuit diagram of a shift register circuit of a single-phase shift register.
Figure 2:
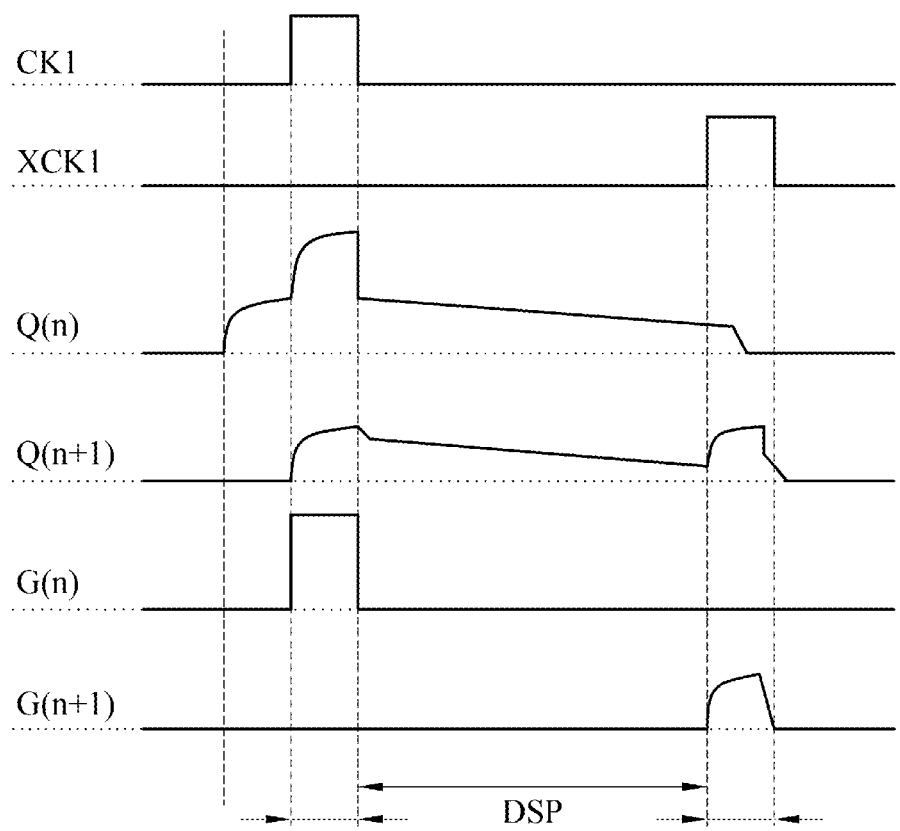
FIG. 2 is a schematic waveform diagram of a conventional shift register.

Embodiments will be described below in detail in conjunction with the accompanying drawings, but the embodiments are not intended to limit the scope of the present invention. The order in which the operations of a structure are described is not to be construed as a limitation, and any structure which is a rearrangement of the components, and the resulting apparatus having an equivalent effect all fall within the scope of the present invention. In addition, the figures are merely illustrative and have not been drawn to scale. To facilitate understanding, same elements in the following description are labeled by the same reference numerals.

The terms "first", "second" and the like used herein do not denote any particular order or sequence, are not intended to limit the present invention, and are used only for distinguishing between elements or operations described with same technical terms.

Additionally, the terms "coupled" and "connected" used herein may mean that two or more elements are in a direct physical or electrical contact or in an indirect physical or electrical contact, and may also mean that two or more elements co-operate or interact.

Figure 3:
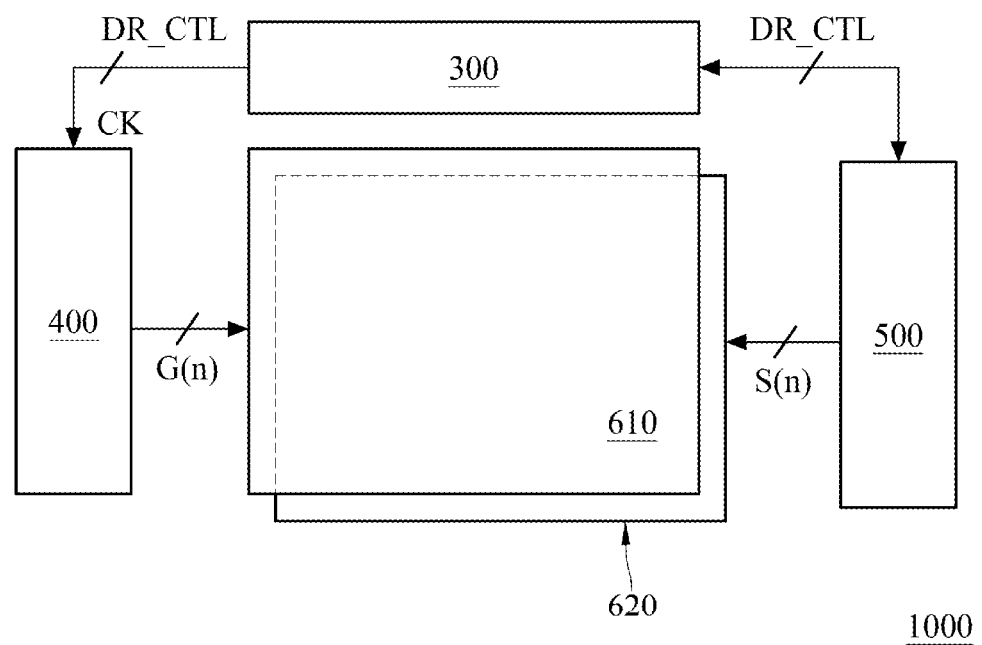
FIG. 3 shows a mobile apparatus according to one embodiment of the present disclosure.

FIG. 3 shows a mobile apparatus according to one embodiment of the present disclosure. A mobile apparatus 1000 includes a scan driver 400 which outputs scan signals G(1)-G(N) for driving scan lines (not shown) of a display panel 610. A touch driver 500 outputs sensing signals S(1)-S(N) for driving sensing lines (not shown) of a touch panel 620, wherein N is a positive integer, the number of the scan signals G(1)-G(N) is not limited to be equal to the number of the sensing signals S(1)-S(N), and the numbers of the scan signals G(1)-G(N) and the sensing signals S(1)-S(N) may also be unequal. The touch panel 620 in the mobile apparatus 1000 may be a capacitive sensing panel, a photo sensing panel, a force sensing panel, a resistive sensing panel, a proximity sensing panel, or the like, but is not limited thereto. A capacitive touch panel is used as an example in embodiments of the detailed description. The display panel 610 and the touch panel 620 may be an in-cell touch panel. However, the present invention is not limited thereto, and a combination of the display panel 610 and the touch panel 620 may be used. The scan driver 400 is configured to sequentially output the scan signals G(1)-G(N) to the display panel 610. The scan driver may be a driving chip attached onto a substrate (not shown), or a gate driver on array (GOA) integrated on a glass substrate, but is not limited thereto. A timing controller 300 may output signals such as a clock signal CK1 and a driving control signal DR_CTL for controlling the operation of the touch driver 500 and the scan driver 400. The driving control signal DR_CTL may be a signal configured to be enabled by a touch, a signal for suspending the display output, or a signal for activating touch sensing, and the driving control signal DR_CTL may also be provided to the scan driver 400 directly or indirectly by the touch driver 500.

The mobile apparatus 1000 outputs the scan signals G(1)-G(N) for driving the scan lines (not shown) of the display panel 610 during a display scanning period of each frame period, and outputs the sensing signals S(1)-S(N) for driving the sensing lines (not shown) of the touch panel 620 during a touch sensing period of each frame period. The display scanning period is sequentially divided into multiple enable periods of the scan lines, and the enable periods of the scan lines disposed next to each other may have a partially overlapping interval or not have an overlapping interval. For example, when a pulse width of the scan signal G(1) is W and the scan signal G(2) next to and immediately following the scan signal G(1) has a delay D, an overlapping interval of two neighboring scan signals is W-D; the delay D between two neighboring clock signals being greater than the pulse width W indicates no overlapping interval between two outputted neighboring scan signals. The frame periods may be time configured to refresh image data for the display panel 610, and the scan driver 400 is notified, according to a synchronization signal SYNC outputted by the timing controller 300, of a new frame period FR started by the mobile apparatus 1000. Generally, a frame refresh rate may be 60 Hz, 120 Hz, or the like, and the present disclosure is not limited thereto.

Figure 4:
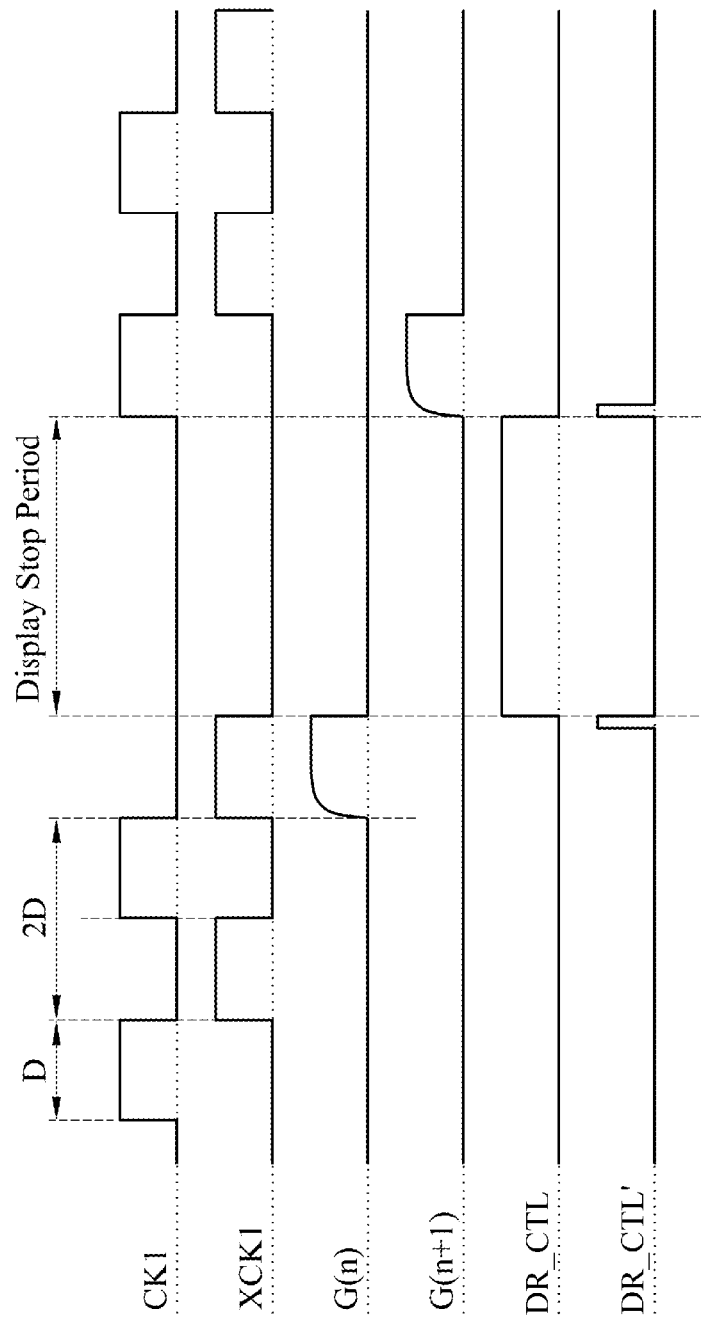
FIG. 4 shows a schematic waveform diagram of clock signals according to one embodiment of the present disclosure.

FIG. 4 shows a schematic waveform diagram of clock signals according to one embodiment of the present disclosure. A clock signal CK1 and a clock signal XCK1 provided to a scan driver 400 are phase-complementary and periodic signals, the clock signal XCK1 and the clock signal CK1 have a delay D with respect to each other, and a period of the clock signals CK1/XCK1 is 2×D. The scan driver 400 alternately enables and sequentially drives, according to the clock signals CK1/XCK1, the scan signals G(1)-G(N). Each frame period includes at least one display stop period DSP. During the display stop period DSP, the driving control signal DR_CTL is provided to the scan driver 400, while the providing of the clock signals CK1/XCK1 to the scan driver 400 is stopped. A length of the display stop period DSP may be determined by the driving control signal DR_CTL and other parameters.

The driving control signal DR_CTL may be a fixed voltage signal having an enable voltage level during the display stop period DSP, and the driving control signal DR_CTL being enabled indicates that the display function is stopped; the driving control signal DR_CTL also may be a pulse signal before the initiation of the display stop period DSP and a pulse signal DR_CTL' after the termination of the display stop period DSP. An initiation signal started by the driving control signal DR_CTL' indicates beginning of the display stop period DSP, and the display scanning function is stopped during the display stop period DSP; and starting of a termination signal by the driving control signal DR_CTL' indicates that the performing of the display scanning function is resumed. However, the present disclosure is not limited thereto, all of the timing controller 300 or the scan driver 400 capable of determining both the initiation and termination signals of the display stop period DSP fall within the claimed scope of the present disclosure.

For example, during the time from the enable period of the first scan line to the enable period of the $n^{th}$ scan line, the clock signal CK1 and the clock signal XCK1 are alternately enabled and the scan signals G(1)-G(n) are sequentially outputted to the corresponding scan lines. When the driving control signal DR_CTL is enabled and provided to the scan driver 400, the display stop period DSP begins. During the display stop period DSP, the providing of the clock signal CK1 and the clock signal XCK1 to the scan driver 400 is stopped, and at this time, the touch driver 500 may be activated to perform the touch sensing function or other functions (not necessarily the touch sensing function). Subsequently, when the driving control signal DR_CTL is disabled and the providing of the clock signal CK1 and the clock signal XCK1 to the scan driver 400 is resumed, the scan signals G(n+1)-G(N) are sequentially outputted to the corresponding scan lines.

Figure 5:
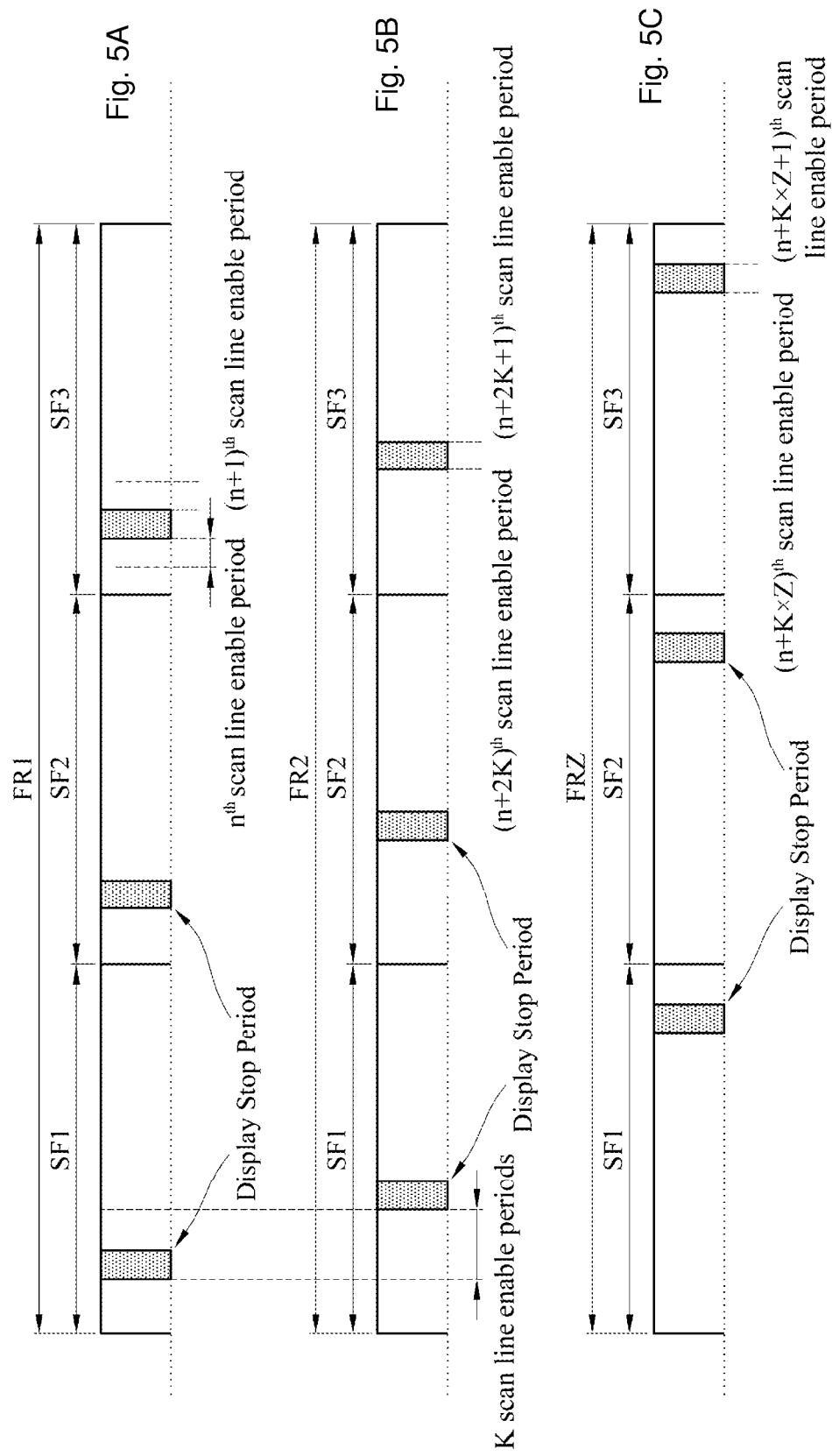
FIGS. 5A-5C show schematic timing diagrams of the display stop periods of different frame periods according to one embodiment of the present disclosure.

FIGS. 5A-5C show schematic timing diagrams of the display stop periods of different frame periods according to one embodiment of the present disclosure. FIG. 5A is the schematic timing diagram of the display stop period of a frame period FR1, FIG. 5B is the schematic timing diagram of the display stop period of a frame period FR2, and FIG. 5C is the schematic timing diagram of the display stop period of a frame period FRZ. Each frame period includes sub-frame periods SF1-SF3, scan signals G(1)-G(N) are outputted during the enable periods of the scan lines of each sub-frame period to respectively drive N scan lines, and the sub-frame periods SF include a display stop period DSP.

Referring to FIG. 5A, during an enable period of a first scan line to an enable period of an $n^{th}$ scan line in the frame period FR1, the scan signal G(1) to the scan signal G(n) are driven alternately by the clock signals CK1/XCK1 and outputted to the display panel 610. When the driving control signal DR_CTL is enabled and provided to the scan driver 400, the display stop period DSP begins At this time, since the providing of the clock signals CK1/XCK1 to the scan driver 400 is disabled, the scan signals are not outputted. When the display stop period DSP terminates, the providing of the clock signals CK1/XCK1 to the scan driver 400 is resumed, and the scan signal G(n+1) to the scan signal G(N) are driven alternately and outputted to the display panel 610. Referring to FIG. 5B, during the enable period of the first scan line to the enable period of the $(n+K)^{th}$ scan line in the frame period FR2, the scan signal G(1) to the scan signal G(n+K) are driven alternately by the clock signals CK1/XCK1 and outputted to the display panel 610. When the driving control signal DR_CTL is enabled and provided to the scan driver 400, the display stop period DSP begins. At this time, since the providing of the clock signals CK1/XCK1 is disabled, a shift register circuit 411 is not conducted and thus the scan signals are not outputted. When the display stop period DSP terminates, the providing of the clock signals CK1/XCK1 to the scan driver 400 is resumed, and the scan signal G(n+K+1) to the scan signal G(N) are driven alternately and outputted to the display panel 610. Then, referring to FIG. 5C, during the enable period of the first scan line to an enable period of an $(n+Z \times K)^{th}$ scan line in the frame period FRZ, the scan signal G(1) to the scan signal G(n+Z×K) are driven alternately by the clock signals CK1/XCK1 to be outputted sequentially along a scanning direction to the display panel 610. The scanning direction may be a direction from a first scan line to an $N^{th}$ scan line from top to bottom in the display panel 610. When the driving control signal DR_CTL is enabled and provided to the scan driver 400, the display stop period DSP begins. At this time, since the clock signals CK1/XCK1 are not provided to the scan driver 400, the scan signals are not outputted. When the display stop period DSP terminates, the providing of the clock signals CK1/XCK1 to the scan driver 400 is resumed, and the scan signal G(n+Z×K+1) to the scan signal G(N) are driven alternately and outputted to the display panel 610. By changing the time positions of the display stop periods DSP of the frame periods successively, shortening of the life-time of driving elements of the scan driver 400 caused by long-time stressing may be avoided. K may be the number of the clock signals, and Z may be an integer not greater than N/K, indicating that the stop time position of the display stop period DSP in each of the Z frame periods varies, and also that the stop time position of the display stop period DSP cycles with a period of Z frame periods. By changing the time positions of the display stop periods DSP successively, the Mura effect of scan lines caused by the display stop periods occurring at the same time position in the prior art can be improved.

In one embodiment of the present disclosure, Z may be a positive integer. When Z is a positive integer, the $Z^{th}$ frame period FRZ indicates one of the consecutive and sequential frame periods; the display stop period DSP of the $Z^{th}$ frame period FRZ may occur between the enable periods of the scan lines of the scan signal G(n+Z×K) and the scan signal G(n+Z×K+1), indicating that an offset direction of the display stop period DSP of each frame period may be the same as the scanning direction.

In another embodiment of the present disclosure, Z also may be a negative integer, and when Z is a negative integer, the absolute value of Z should be taken to indicate the $Z^{th}$ frame period FRZ as one of the consecutive and sequential frame periods; the display stop period DSP of the $Z^{th}$ frame period FRZ may occur between the enable periods of the scan lines of the scan signal G(n+Z×K) and the scan signal G(n+Z×K+1), indicating that an offset direction of the display stop period DSP of each frame period may be opposite to the scanning direction. The difference between the initiation time positions of the display stop periods of any two consecutive frame periods of the frame periods is the offset. The initiation time position of the display stop period of each frame period is offset along the offset direction.

Referring to FIG. 5A again in combination with FIG. 1, the shift register circuit 100 includes the driving unit 110 and the pull-up unit 120. The driving unit 110 may be conducted to output the scan signal G(n) according to the clock signal CK1, and the pull-up unit 120 may be conducted to raise the voltage level of the driving node Q according to the previous-stage scan signal. In addition to the connections above, the driving unit 110 and the pull-up unit 120 of the shift register circuit 100 may also receive the previous-stage scan signal according to the clock signal XCK1 inverted with respect to the clock signal CK1. The shift register circuit of the scan driver in the art of display apparatuses may also be implemented in various ways. However, only one implementation is discussed as an example in the specification, and the present disclosure is not limited thereto. Any shift register circuit with a connection method of transistors in combination with the driving method of the present disclosure that is capable of achieving the technical effects of the present disclosure falls within the scope of the present disclosure.

When the display stop period DSP of the frame period FR1 occurs between the enable periods of the scan lines of the scan signal G(n) and the scan signal G(n+1), the clock signals CK1/XCK1 are disabled such that the driving units 110 of the $n^{th}$-stage and $(n+1)^{th}$-stage shift register circuits 100 are in a cut-off state. However, at this time, the $n^{th}$-stage and the $(n+1)^{th}$-stage shift register circuits 100 have received the previous-stage scan signal and the pull-up unit 120 is conducted, thus maintaining the driving nodes Q of the $n^{th}$-stage and the $(n+1)^{th}$-stage shift register circuits 100 at the high voltage level. Accordingly, transistor(s) of the driving unit 110 is stressed because the driving unit 110 is constantly under a bias voltage. Therefore, according to one embodiment of the present disclosure, long-time stress on driving elements of a shift register circuit of a specific stage in the scan driver 400 is avoided by changing the time positions of the display stop periods in different frame periods successively, thus reducing the Mura effect.

Figure 6:
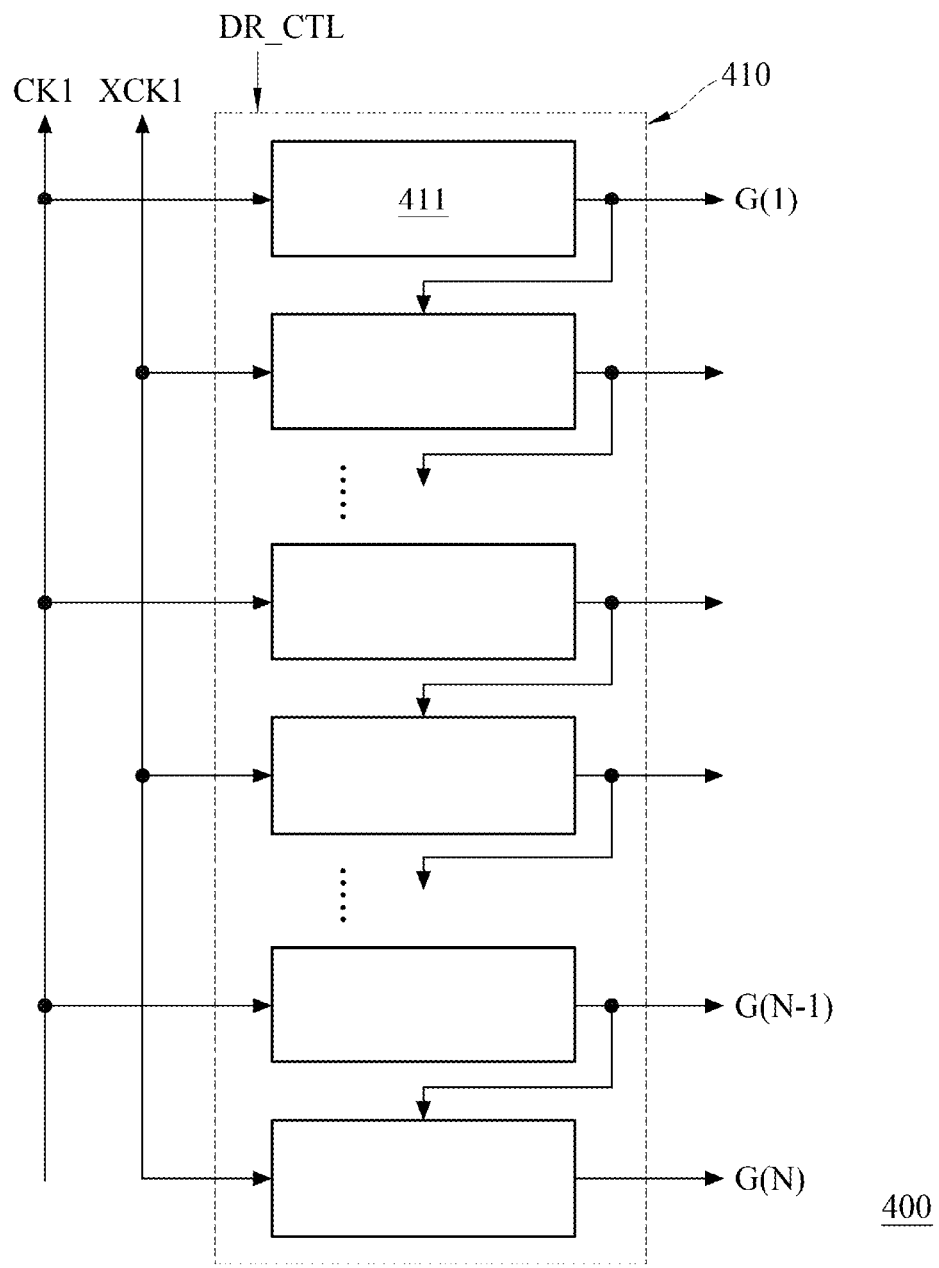
FIG. 6 shows a schematic diagram of a scan driver according to one embodiment of the present disclosure.

FIG. 6 shows a schematic diagram of a scan driver according to one embodiment of the present disclosure. The scan driver 400 may be made of a shift register 410 including multiple stages of shift register circuits 411. The scan signals G(1)-G(n) are outputted by providing signals alternately according to a set of complementary clock signals CK1/XCK1, wherein two neighboring shift register circuits 411 driven according to different clock signals CK1/XCK1 respectively output neighboring scan signals (e.g., G(N−1) and G(N)) sequentially. The shift register 410 may further implement the display stop period DSP according to the driving control signal DR_CTL. Details of internal elements of the shift register circuit 411 are generally the same as or similar to those of the shift register circuit 100. Herein, the shift register circuit 411 is used as a general designation and not further described here, but the shift register circuit 411 is not limited to be implemented in a single way.

Figure 7:
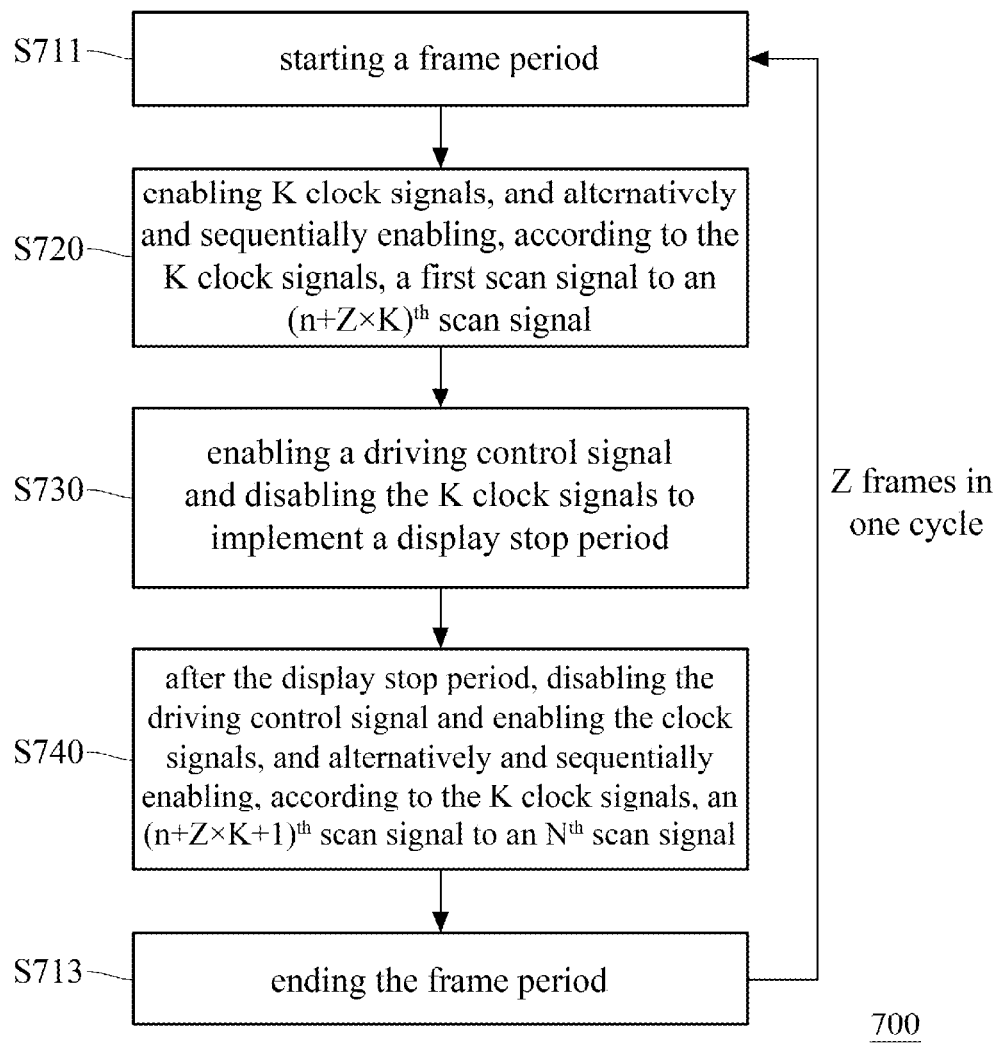
FIG. 7 shows a flow chart of a driving method for scan signals according to one embodiment of the present disclosure.

A driving method according to one embodiment of the present disclosure is described in detail below. FIG. 7 shows a flow chart of a driving method for scan signals according to one embodiment of the present disclosure. A driving method 700 includes:

S711: starting a frame period;

S720: enabling K clock signals, and alternately and sequentially enabling, according to the K clock signals, a scan signal G(1) to a scan signal G(n+Z×K);

S730: enabling a driving control signal DR_CTL and disabling the K clock signals to implement a display stop period DSP;

S740: after the display stop period, disabling the driving control signal and enabling the K clock signals, and alternately and sequentially enabling, according to the K clock signals, a scan signal G(n+Z×K+1) to a scan signal G(N); and S713: ending the frame period.

The initiation and the termination of one frame period are notified in the step 711 and the step 713, and may be implemented according to a notification of a synchronization signal of the timing controller 300. In the step S720, during one frame period, K clock signals are received by the shift register 410 and provided alternately and periodically to a first-stage shift register circuit 411 to an $(n+Z\times K)^{th}$-stage shift register circuit 411, for outputting the scan signal G(1) to the scan signal G(n+Z×K) to the display panel 610. In the step S730, when the driving control signal DR_CTL is enabled and the K clock signals are disabled, the display stop period DSP is performed; and at this time the shift register 410 does not output the scan signals due to the lack of driving from the clock signals. In the step S740, when the driving control signal DR_CTL is disabled and K clock signals are provided again to the shift register 410, the scan signal G(n+Z×K+1) to the scan signal G(N) are alternately and sequentially enabled according to the K clock signals, in which N denotes the number of the scan lines of the display panel 610 or the number of the shift register circuits 411 capable of outputting the scan signals, Z indicates that the timing controller 300 counts to the $Z^{th}$ frame period, and Z is a positive integer not greater than (N/K). Thus, the time positions of the display stop periods DSP in the Z frame periods vary from each other by periodically changing the time positions of the display stop periods DSP (the displacement of the time positions may be related to the number of the clock signals). Therefore, the Mura effect caused by long-time stressing on the driving elements of the shift register circuits 411 maybe reduced, and the time duration of stressing is generally equal on the shift register circuits 411 of all stages, thereby improving display quality.

Figure 8:
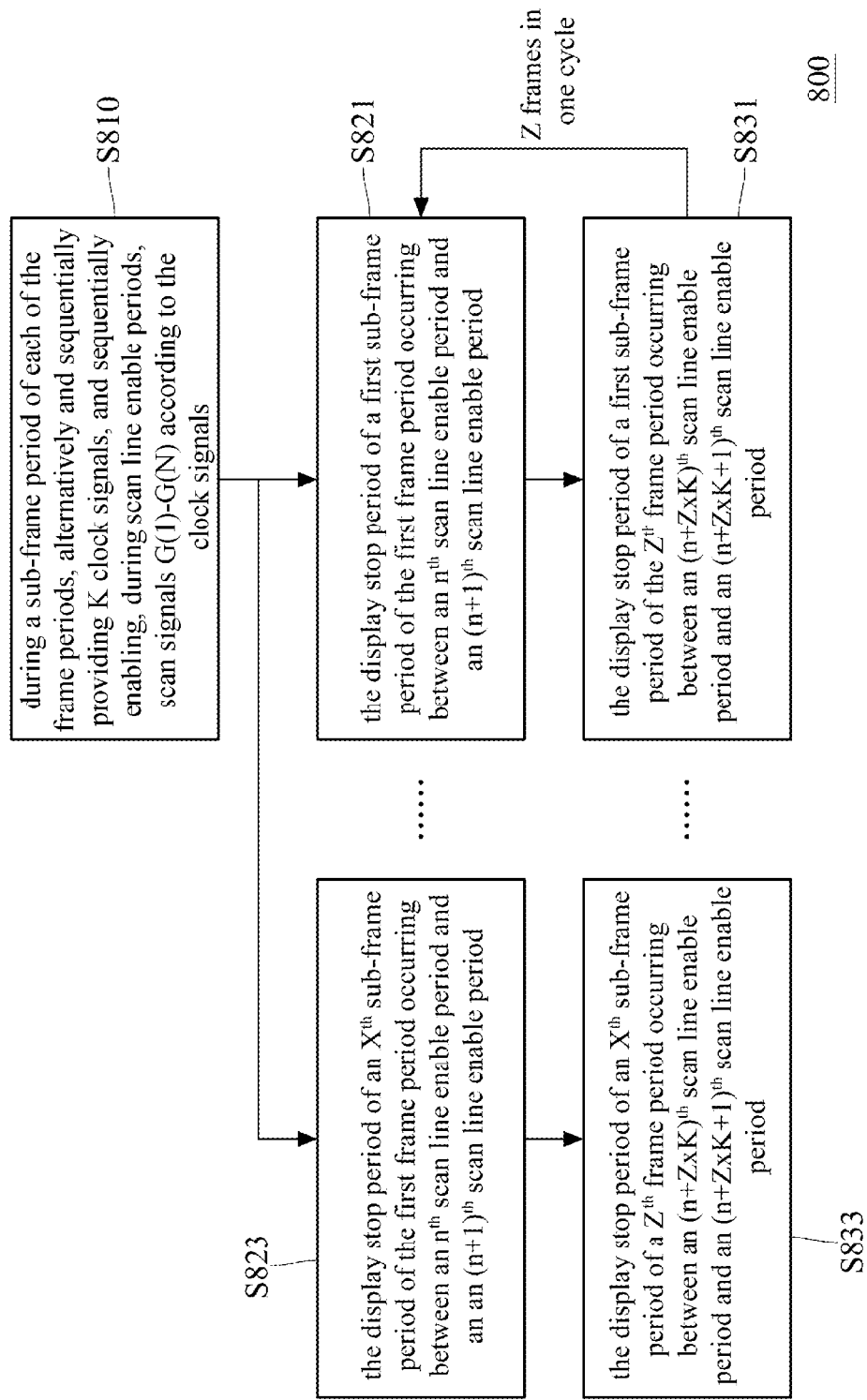
FIG. 8 shows a flow chart of a driving method for scan signals according to another embodiment of the present disclosure.

FIG. 8 shows a flow chart of a driving method for scan signals according to another embodiment of the present disclosure. The driving method 800 includes:

S810: during sub-frame periods of each frame period, alternately and sequentially providing K clock signals, and during enable periods of scan lines, sequentially enabling scan signals G(1)-G(N) according to the clock signals;

S821: the display stop period DSP of a first sub-frame period of a first frame period occurring between an enable period of an $n^{th}$ scan line and an enable period of an $(n+1)^{th}$ scan line;

S831: the display stop period DSP of a first sub-frame period of the $Z^{th}$ frame period occurring between an enable period of an $(n+Z\times K)^{th}$ scan line and an enable period of an $(n+Z\times K+1)^{th}$ scan line;

S823: the display stop period DSP of a $X^{th}$ sub-frame period of the first frame period occurring between the enable period of the $n^{th}$ scan line and the enable period of the $(n+1)^{th}$ scan line; and S833: the display stop period DSP of an $X^{th}$ sub-frame period of the $Z^{th}$ frame period occurring between the enable period of the $(n+Z\times K)^{th}$ scan line and the enable period of the $(n+Z\times K+1)^{th}$ scan line.

In the step S810, during each frame period, the timing controller 300 alternately and sequentially provides the K clock signals to the scan driver 400, such that the scan driver 400 can sequentially enable the scan signal G(1) to the scan signal G(N) according to the clock signals during the enable periods of the scan lines. In the step S821, during the sub-frame period SF1 of the frame period FR1, the timing controller 300 determines that the display stop period DSP occurs between the enable period of the $n^{th}$ scan line and the enable period of the $(n+1)^{th}$ scan line; during the display stop period DSP, the driving control signal DR_CTL is outputted to the scan driver 400. In the step S831, during the sub-frame period SF1 of the frame period FRZ, the timing controller 300 determines that the display stop period DSP occurs between the enable period of the $(n+Z\times K)^{th}$ scan line and the enable period of the $(n+Z\times K+1)^{th}$ scan line; and during the display stop period DSP, the driving control signal DR_CTL is outputted to the scan driver 400, wherein the enable periods of the scan lines are the times during which the plurality of scan signals respectively enable the corresponding scan lines, i.e., the pulse width W of each scan signal, two neighboring enable periods of the scan lines may have an overlapping interval, and the display stop period DSP and the enable periods of the scan lines do not overlap with each other. By periodically changing the time positions of the display stop periods DSP through the control of the timing controller 300, the Mura effect caused by long-time stressing on the driving elements of the shift register circuit 411 may be reduced, thereby improving display quality.

However, further in the driving method 800, each frame period includes X sub-frame periods, and N scan lines may be driven respectively during each sub-frame period; namely, N scan signals are configured to be outputted during each sub-frame period, and thus X×N scan signals in total may be outputted to the corresponding scan lines during one frame period, in which X may be a positive integer. In the step S823, during the sub-frame period SFX of the frame period FR1, the timing controller 300 determines that the display stop period DSP occurs between between the enable period of the $n^{th}$ scan line and the enable period of the $(n+1)^{th}$ scan line; during the display stop period DSP, the driving control signal DR_CTL is outputted to the scan driver 400. In the step S833, during the sub-frame period SFX of the frame period FRZ, the timing controller 300 determines that the display stop period DSP occurs between the enable period of the $(n+Z \times K)^{th}$ scan line and the enable period of the $(n+Z \times K+1)^{th}$ scan line, and during the display stop period DSP, the driving control signal DR_CTL is outputted to the scan driver 400. A plurality of sub-frame periods are disposed in each frame period, and each of the sub-frame periods SF1-SFX has one display stop period DSP, such that multiple display stop periods DSP may be present in one frame period, allowing the mobile apparatus 1000 to perform functions other than the display function, for example, the touch function.

First Embodiment

Figure 9A:
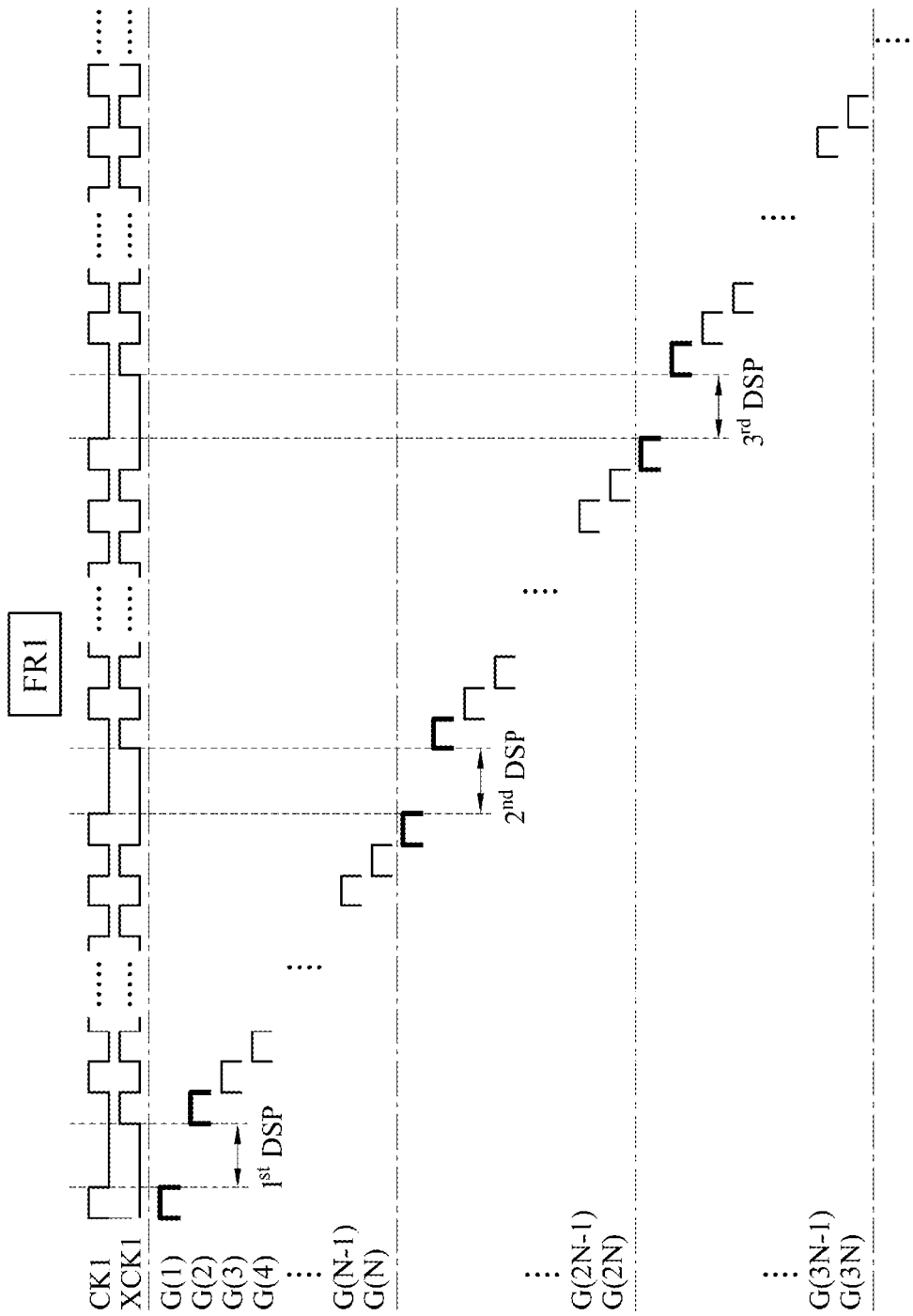
FIGS. 9A-9C show schematic timing diagrams of scan signals during different frame periods according to a first embodiment of the present disclosure.
Figure 9B:
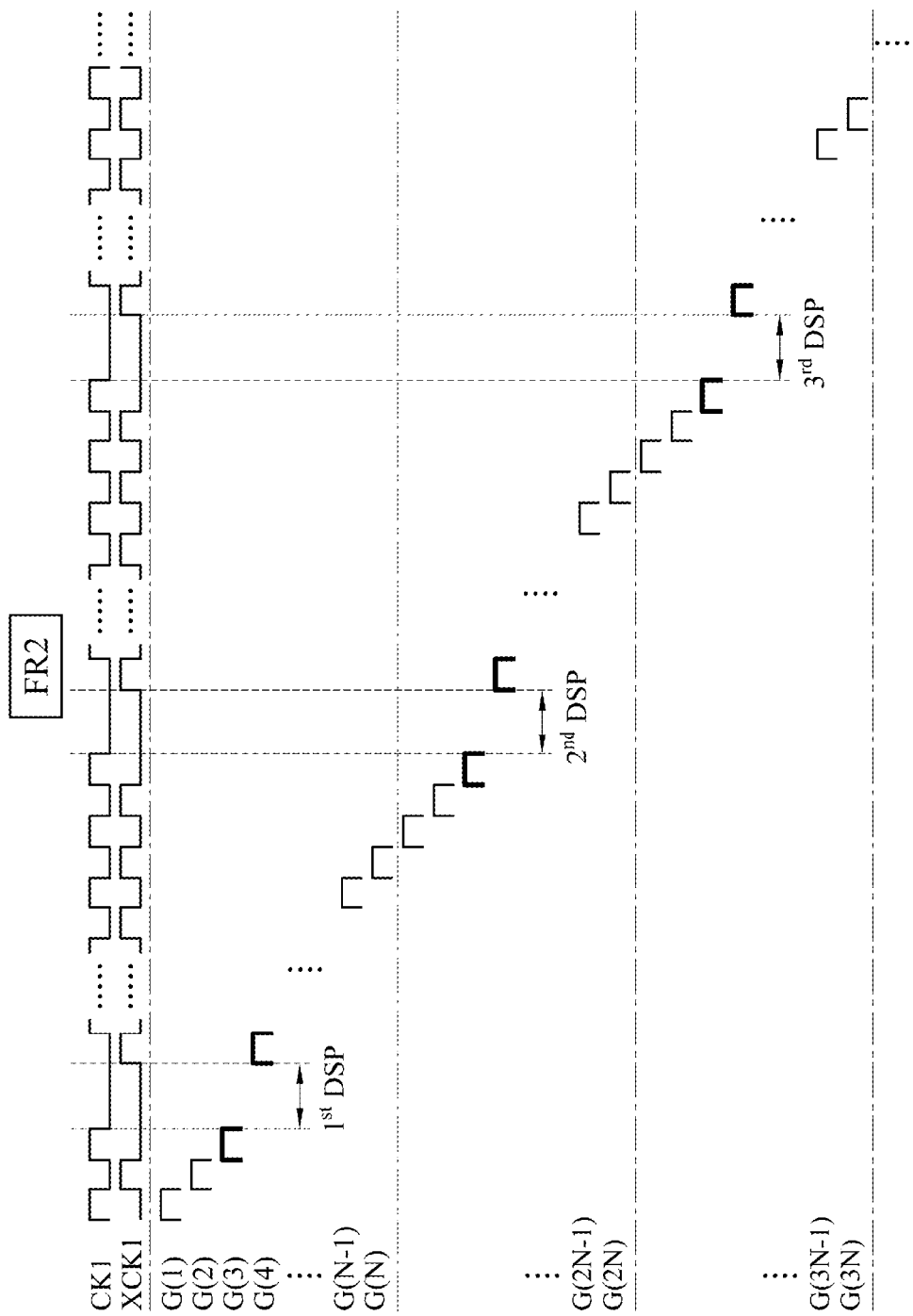
Figure 9C:
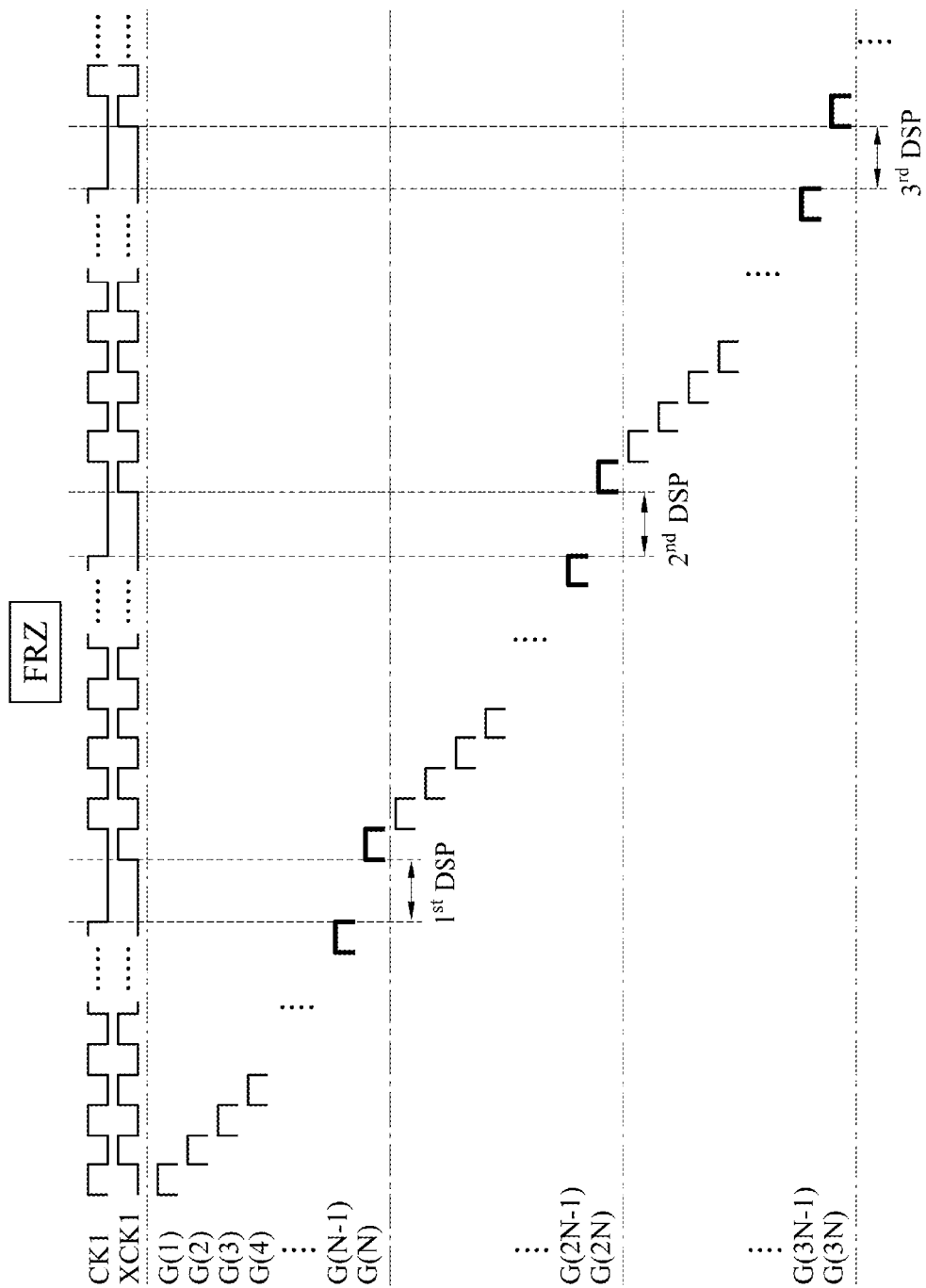

FIGS. 9A-9C show schematic timing diagrams of scan signals during different frame periods according to a first embodiment of the present disclosure. For the first embodiment, the shift register 410 receives single-phase clock signals, indicating that only one pair of phase-complementary clock signals CK1 and XCK1 is provided to the shift register circuit 411, and thus K is equal to 2. Namely, the shift register 410 outputs, according to the clock signals CK1, scan signals G(1), G(3), G(5), G(7), and so on; and alternately outputs, according to the clock signal XCK1, scan signals G(2), G(4), G(6), G(8), and so on.

Each frame period has three sub-frame periods during which N scan signals may be respectively provided to the display panel 610; namely, each frame period may provide 3×N scan signals in total to corresponding scan lines, wherein N is a positive integer. The number of the sub-frame periods SF may be determined by the number of scan lines of the display panel 610. For example, when the number of the scan lines of the display panel 610 is 3×N, three display stop periods DSP may exist. However, the present disclosure is not limited thereto, and the number of the display stop periods may be designed according to the designer or actual requirements.

Referring to FIGS. 9A-9C in combination with FIGS. 1 and 6, FIG. 9A shows a schematic timing diagram of scan signals of the frame period FR1; FIG. 9B shows a schematic timing diagram of scan signals of the frame period FR2; and FIG. 9C shows a schematic timing diagram of scan signals of the frame period FRZ. The shift register 410 drives the plurality of shift register circuits 411 alternately according to the two clock signals CK1/XCK1, and neighboring shift register circuits 411 are configured to receive the clock signals having different phases. When the display stop period DSP occurs between the enable period of the $n^{th}$-stage scan line and the enable period of the $(n+1)^{th}$-stage scan line, the scan signal G(n−1) and the scan signal G(n) have been provided to the $n^{th}$-stage shift register circuit 411 and the $(n+1)^{th}$-stage shift register circuit 411 respectively, such that the driving nodes Q in the $n^{th}$-stage shift register circuit 411 outputting the scan signal G(n) and in the $(n+1)^{th}$-stage shift register circuit 411 outputting the scan signal G(n+1) are maintained at the high voltage level during the display stop period DSP, thus constantly stressing gate end(s) of transistor(s) in the driving unit 110 and reducing life-time of the element(s). This stressing effect is particularly serious for the shift register circuits 411 in the stages that are n stages or n+1 stages before and after the display stop period DSP. Therefore, the present disclosure proposes changing the time positions of the display stop periods DSP successively, such that the Mura effect of the scan lines caused by constant stress on the same shift register circuit 411 is reduced.

Referring to FIG. 9A, during each of sub-frame periods SF1-SF3 of the frame period FR1, the display stop period DSP occurs between the enable periods of the scan lines of the scan signal G(1) and the scan signal G(2) of each sub-frame period. Referring to FIG. 9B, during each of sub-frame periods SF1-SF3 of the frame period FR2, the display stop period DSP occurs between the enable periods of the scan lines of the scan signal G(3) and the scan signal G(4) of each sub-frame period, wherein the frame period FR2 occurs immediately next to the frame period FR1. Next, during each of sub-frame periods SF1-SF3 of the frame period FRZ, the display stop period DSP occurs between the enable periods of the scan lines of the scan signal G(N−1) and the scan signal G(N) of each sub-frame period; namely, the display stop period DSP occurs between the scan signal G(N−1) and the scan signal G(N) of the sub-frame period SF1, the display stop period DSP occurs between the scan signal G(2N−1) and the scan signal G(2N) of the sub-frame period SF2, and the display stop period DSP occurs between the scan signal G(3N−1) and the scan signal G(3N) of the sub-frame period SF3. Z may be a positive integer not greater than (N/K), and in one preferred embodiment, N/K is generally equal to Z. In other words, N/K may be exactly Z, or Z may be a positive integer by rounding N/K to the nearest integer. The display stop period DSP of the frame period FRZ+1 may be the same as the display stop period DSP of the frame period FR1, and the above-mentioned frame periods are a plurality of sequential and consecutive frame periods. By periodically changing the time positions of the display stop periods DSP every Z frame periods successively, the shift register circuit 411 of each stage is subjected to the stress uniformly, and no specific shift register circuit 411 is subjected to constant stress, thus achieving the effect of reducing the Mura effect of display lines of the display panel 610.

Second Embodiment

Figure 10:
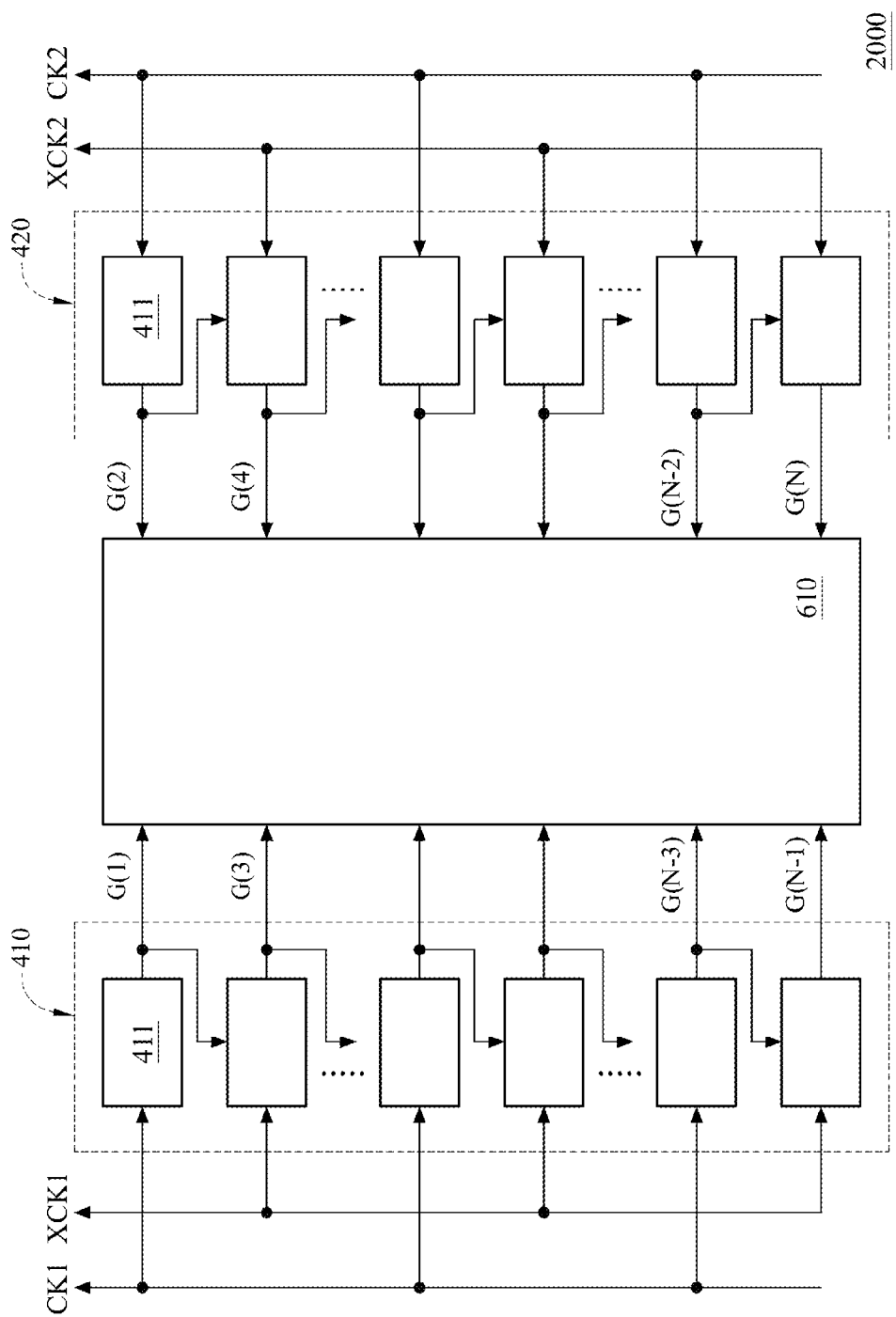
FIG. 10 shows a mobile apparatus according to a second embodiment of the present disclosure.

FIG. 10 shows a mobile apparatus 2000 according to a second embodiment of the present disclosure. A scan driver 400 of the mobile apparatus 2000 is a 2-phase scan driver, the scan driver 400 may include a shift register 410 and a shift register 420 respectively disposed in peripheral areas at two sides of a display panel 610. The shift register 410 and the shift register 420 are driven according to two sets of clock signals CK1/XCK1 and clock signals CK2/XCK2 (4 clock signals in total), respectively. The clock signal CK1 and the clock signal CK2 have one delay D, and the clock signal XCK1 and the clock signal XCK2 also have one delay. The clock signal CK1 and the clock signal XCK1 are phase-complementary and periodic signals, and the clock signal CK2 and the clock signal XCK2 are also phase-complementary and periodic signals. The clock signals CK1/CK2/XCK1/XCK2 sequentially have one delay D and the clock signals CK1/CK2/XCK1/XCK2 respectively have a period of 4×D. The shift register 410 is configured to provide scan signals for odd scan lines and the shift register 420 is configured to provide scan signals for even scan lines. The shift registers may respectively include a plurality of shift register circuits 411 for outputting a scan signal G(n). Namely, the shift register 410 alternately outputs, according to the clock signals CK1/XCK1, the scan signals G(1), G(3), G(5), G(7), G(9), and so on; the shift register 420 alternately outputs, according to the clock signals CK2/XCK2, the scan signals G(2), G(4), G(6), G(8), G(10), and so on.

The scan driver 400 of the mobile apparatus 2000 also may include one shift register disposed at one side of the display panel 610 for sequentially receiving clock signals CK1/CK2/XCK1/XCK2. However, the present disclosure is not limited thereto, and any shift register operating according to four clock signals that have one delay D and are periodically provided to the scan driver 400 falls within the scope of the present disclosure.

The shift register 410 and the shift register 420 respectively include multiple stages of shift register circuits 411, and each of the above-mentioned shift register circuits may be the same as or similar to the shift register circuit 100. One or more mobile apparatuses for implementing the driving method of the present disclosure are provided as examples, but are not intended to limit the scope of the present disclosure. The present disclosure is not limited thereto, and should encompass all embodiments whose display stop periods occur in a plurality of frame periods successively.

Figure 11A:
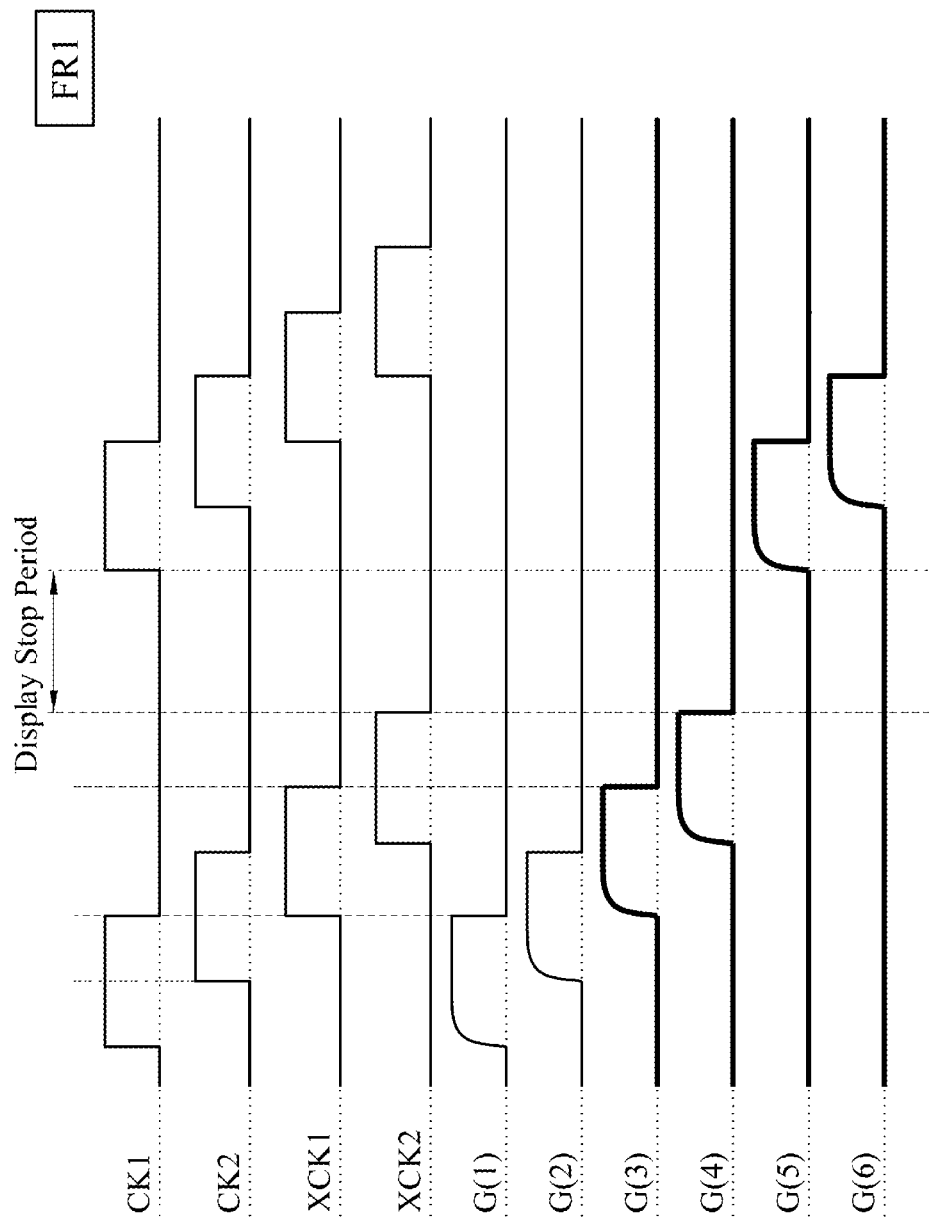
FIGS. 11A-11B show schematic timing diagrams of scan signals during different frame periods according to the second embodiment of the present disclosure.
Figure 11B:
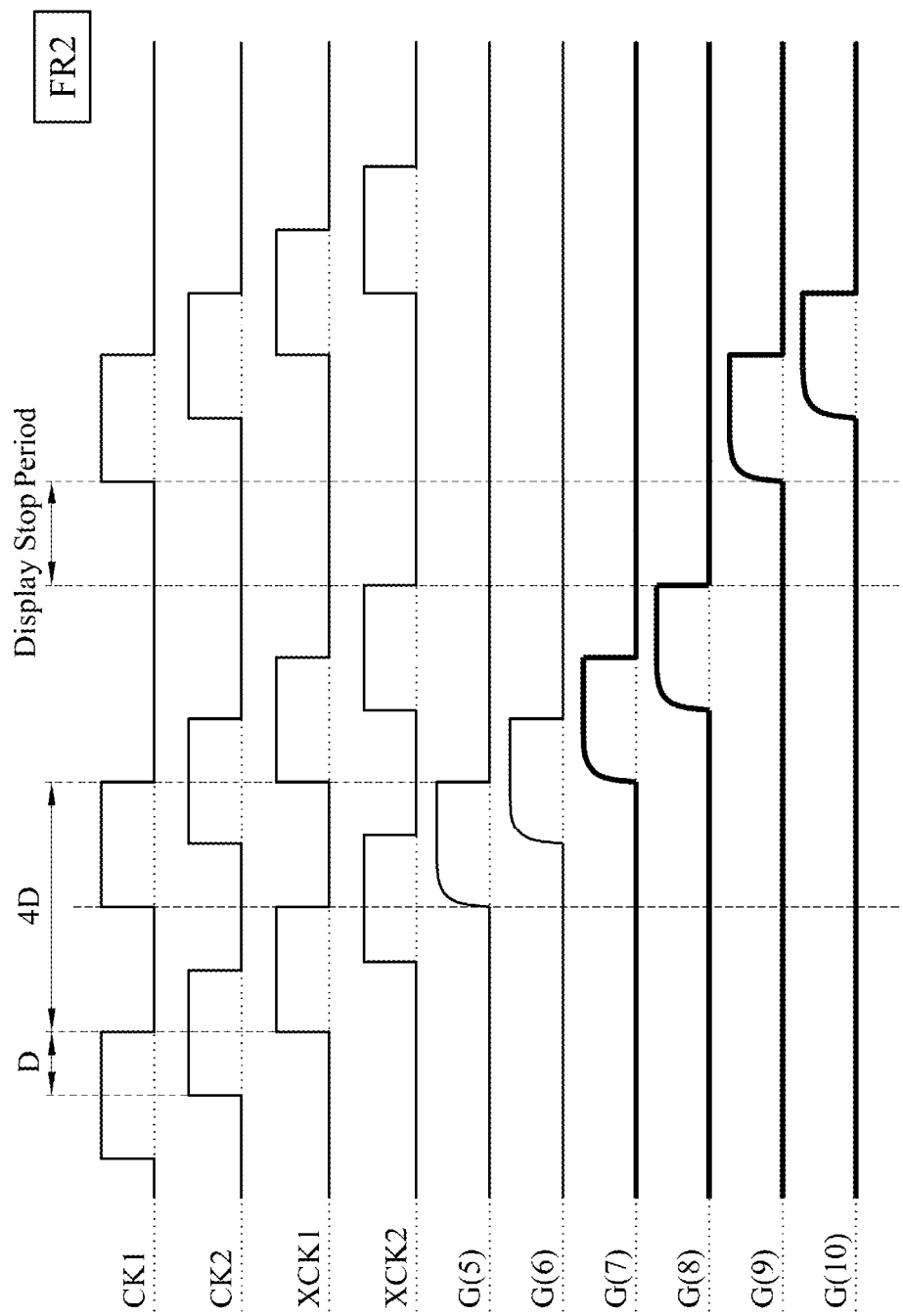

Referring to FIGS. 11A-11B in combination with FIG. 10, FIGS. 11A-11B show schematic timing diagrams of scan signals during different frame periods according to the second embodiment of the present disclosure. FIG. 11A shows a schematic timing diagram of scan signals of the frame period FR1; FIG. 11B shows a schematic timing diagram of scan signals of the frame period FR2. Referring to FIG. 11A, during the frame period FR1, when the display stop period DSP occurs between the enable periods of the scan lines of the scan signal G(4) and the scan signal G(5), the driving nodes Q of the $4^{th}$-stage and $6^{th}$-stage shift register circuits 411 are maintained at the high voltage level since the scan signal G(2) and the scan signal G(4) have been respectively provided to the $4^{th}$-stage and $6^{th}$-stage shift register circuits 411, and the driving nodes Q of the $3^{rd}$-stage and $5^{th}$-stage shift register circuits 411 are maintained at the high voltage level since the scan signal G(1) and the scan signal G(3) have been respectively provided to the $3^{rd}$-stage and $5^{th}$-stage shift register circuits 411. Therefore, stressing of the driving transistors are caused by the high voltage level at the driving nodes Q of the $3^{rd}$-stage, $4^{th}$-stage, $5^{th}$-stage to $6^{th}$-stage shift register circuits 411.

In order to avoid constantly applying a bias voltage on the driving elements of a specific stage, the time positions of the display stop periods DSP are shifted by K enable periods of the scan lines along the offset direction for two different consecutive frame periods in an embodiment of the present disclosure, wherein K is the number of the clock signals. In other words, when the display stop period DSP of the frame period FR1 is between the enable periods of the scan lines of the scan signal G(4) and the scan signal G(5), then the display stop period DSP of the frame period FR2 is between the enable periods of the scan lines of the scan signal G(8) and the scan signal G(9); and the display stop period DSP of the frame period FR3 is between the enable periods of the scan lines of the scan signal G(12) and the scan signal G(13), and so on.

Referring to FIG. 11B, during the frame period FR2 immediately next to the frame period FR1, the display stop period DSP occurs between the enable periods of the scan lines of the scan signal G(8) and the scan signal G(9); at this time, the shift register circuits subjected to stressing are the $7^{th}$-stage to the $10^{th}$-stage shift register circuits. The same is also true for remaining subsequent frame periods, which are not further described here.

Third Embodiment

Figure 12:
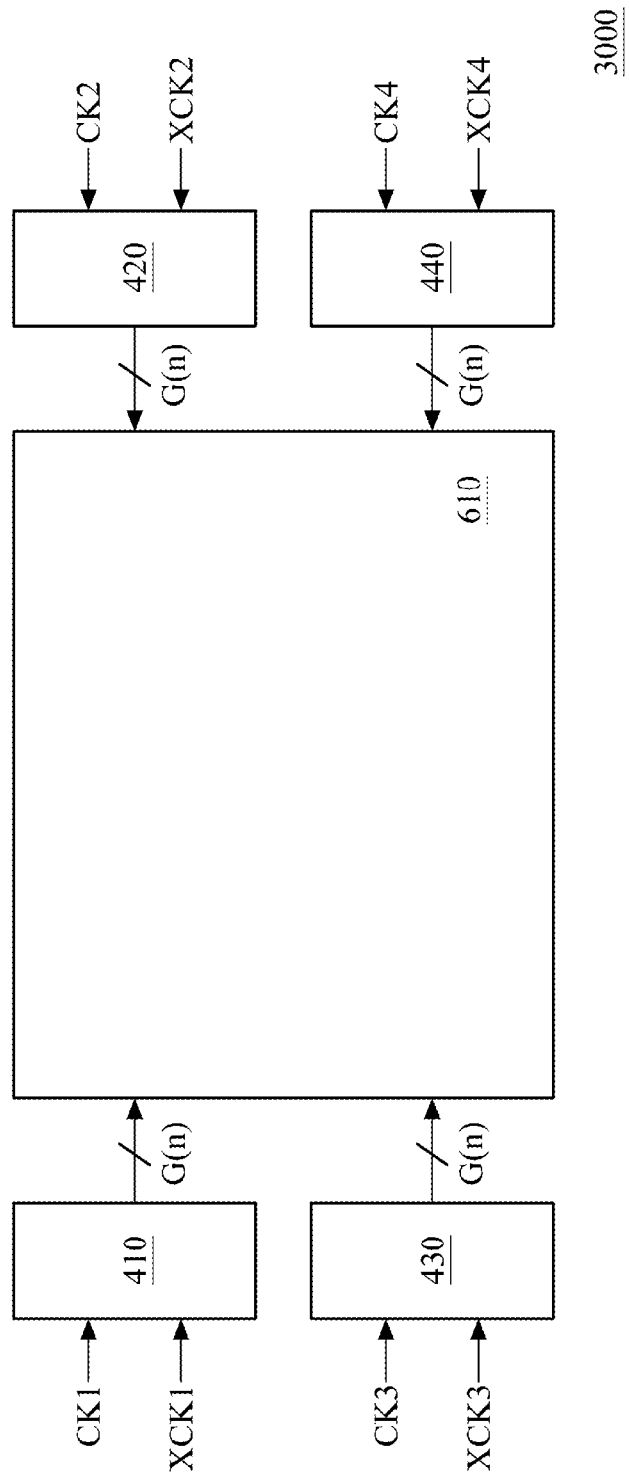
FIG. 12 shows a mobile apparatus according to a third embodiment of the present disclosure.

FIG. 12 shows a mobile apparatus 3000 according to a third embodiment of the present disclosure. A scan driver 400 of the mobile apparatus 3000 is a 4-phase scan driver, the scan driver 400 may include shift registers 410, 420, 430, 440 respectively disposed at opposite sides or one side of a display panel 610, and the shift registers 410, 420, 430, 440 may respectively include multiple shift register circuits 411. The shift register 410 outputs scan signals according to a set of phase-complementary clock signals CK1/XCK1, the shift register 420 outputs scan signals according to a set of phase-complementary clock signals CK2/XCK2, the shift register 430 outputs scan signals according to a set of phase-complementary clock signals CK3/XCK3, and the shift register 440 outputs scan signals according to a set of phase-complementary clock signals CK4/XCK4.

Figure 13:
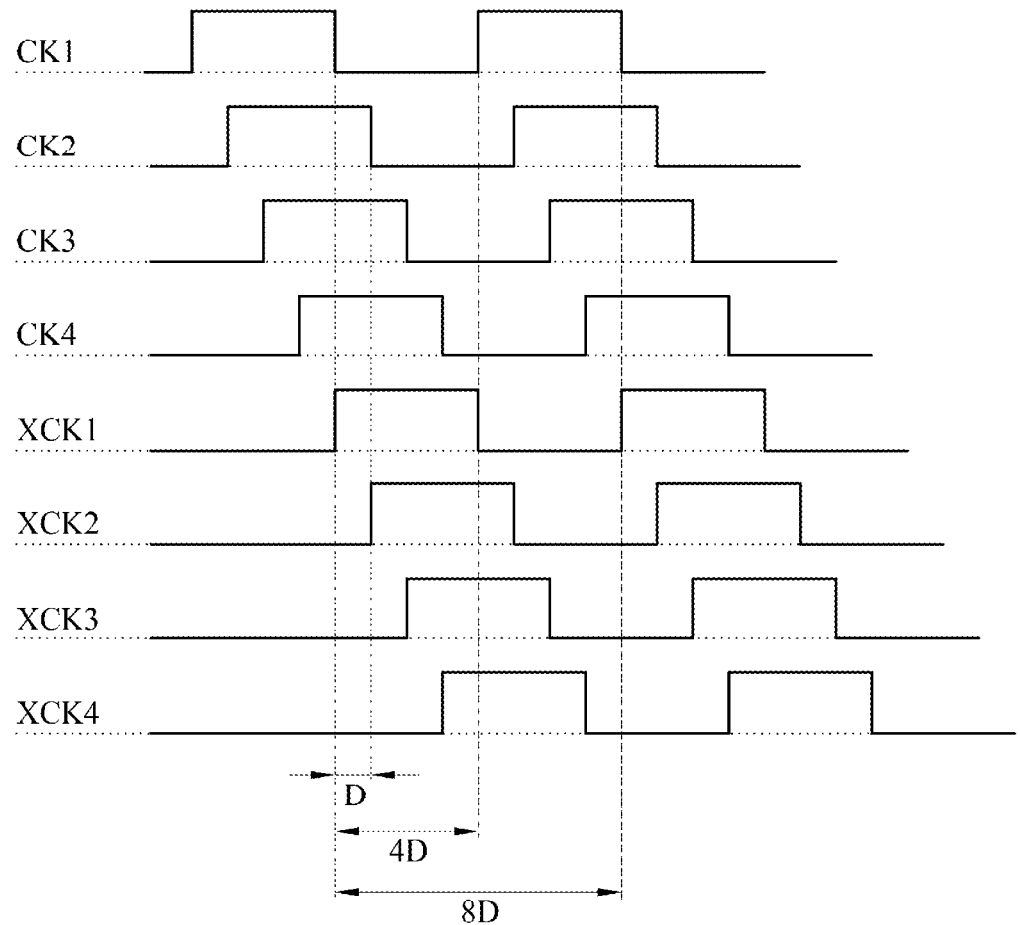
FIG. 13 shows a schematic waveform diagram of clock signals according to the third embodiment of the present disclosure.

FIG. 13 shows a schematic waveform diagram of clock signals according to the third embodiment of the present disclosure. The clock signals CK1/CK2/CK3/CK4/XCK1/XCK2/XCK3/XCK4 may be periodic signals that have one delay D in the above-mentioned order and a period of 8×D, and the number of the clock signals is 8. Namely, the shift register 410 alternately outputs, according to the clock signals CK1/XCK1, the scan signals G(1), G(5), G(9), G(13), G(17), G(21), and so on; the shift register 420 alternately outputs, according to the clock signals CK2/XCK2, the scan signals G(2), G(6), G(10), G(14), G(18), G(22), and so on; the shift register 430 alternately outputs, according to the clock signals CK3/XCK3, the scan signals G(3), G(7), G(11), G(15), G(19), G(23), and so on; the shift register 440 alternately outputs, according to the clock signals CK4/XCK4, the scan signals G(4), G(8), G(12), G(16), G(20), G(24), and so on.

Figure 14:
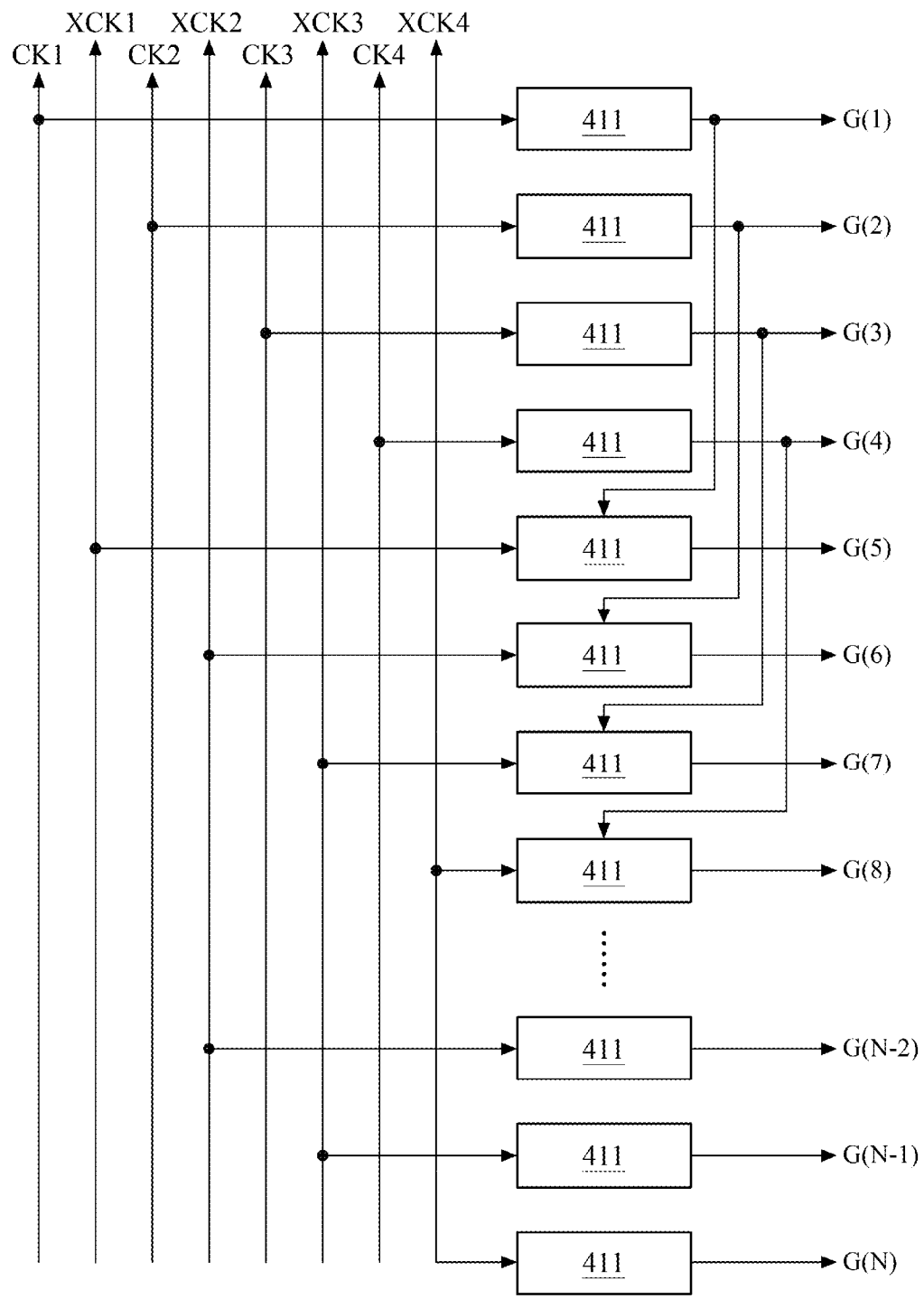
FIG. 14 shows a schematic diagram of a scan driver according to the third embodiment of the present disclosure.

FIG. 14 shows a schematic diagram of the scan driver 400 according to the third embodiment of the present disclosure. The shift registers 410, 420, 430, 440 also may be an integrated scan driver 400 having multiple shift register circuits 411 for outputting N scan signals G(1)-G(N). Assuming that each frame period has one display stop period DSP, when the display stop period DSP of the frame period FR1 occurs between the enable periods of the scan lines of the scan signal G(4) and the scan signal G(5), the driving nodes Q in the $1^{st}$-stage to $8^{th}$-stage shift register circuits 411 are maintained at the high voltage level during the display stop period DSP, because the scan signals G(1), G(2), G(3), G(4) have been provided to the $5^{th}$-stage to $8^{th}$-stage shift register circuits 411 respectively, thus constantly stressing driving elements and reducing life-time of the element(s).

In one embodiment of the present disclosure, the time positions of the display stop periods DSP are shifted by K enable periods of the scan lines along the offset direction for two consecutive frame periods, wherein K is the number of the clock signals. In other words, when the display stop period DSP of the frame period FR1 is between the enable periods of the scan lines of the scan signal G(4) and the scan signal G(5), then the display stop period DSP of the frame period FR2 immediately next to the frame period FR1 is between the enable periods of the scan lines of the scan signal G(12) and the scan signal G(13); and the display stop period DSP of the frame period FR2 immediately next to the frame period FR3 is between the enable periods of the scan lines of the scan signal G(20) and the scan signal G(21), and so on, and thus not further described here. Moreover, the display stop period DSP of the frame period FR1 does not necessarily occur between the enable periods of the scan lines of the scan signal G(4) and the scan signal G(5), and may occur between the enable periods of the scan lines of any two neighboring scan signals G(n) and G(n+1). However, the present disclosure is not limited thereto.

Fourth Embodiment

Figure 15:
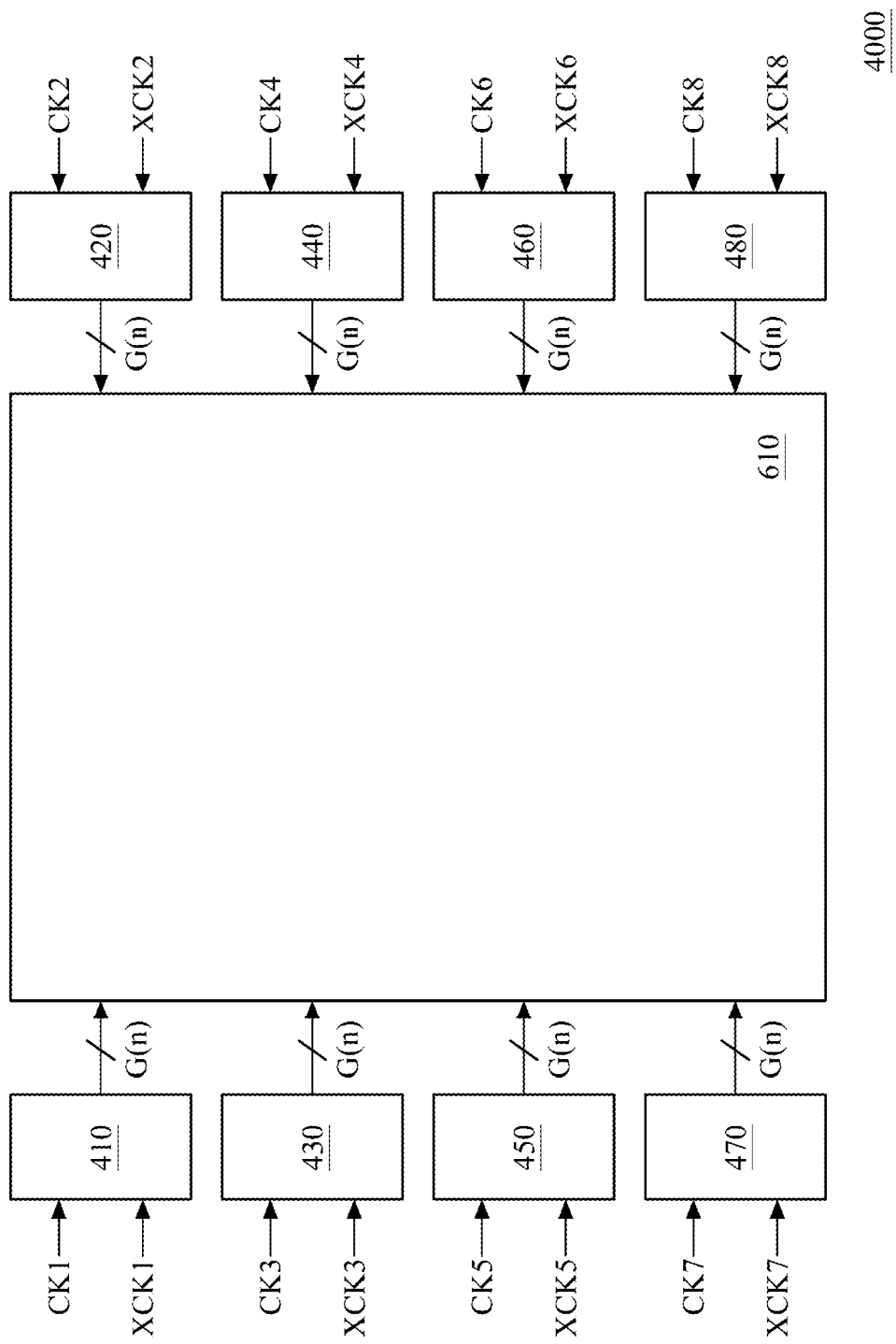
FIG. 15 shows a mobile apparatus according to a fourth embodiment of the present disclosure.

FIG. 15 shows a mobile apparatus 4000 according to a fourth embodiment of the present disclosure. A scan driver 400 of the mobile apparatus 4000 is an 8-phase scan driver, and the scan driver 400 may include shift registers 410, 420, 430, 440, 450, 460, 470, 480 respectively disposed in peripheral areas at opposite sides or one or more sides of a display panel 610. The shift register 410 outputs scan signals according to a set of phase-complementary clock signals CK1/XCK1, the shift register 420 outputs scan signals according to a set of phase-complementary clock signals CK2/XCK2, the shift register 430 outputs scan signals according to a set of phase-complementary clock signals CK3/XCK3, the shift register 440 outputs scan signals according to a set of phase-complementary clock signals CK4/XCK4, the shift register 450 outputs scan signals according to a set of phase-complementary clock signals CK5/XCK5, the shift register 460 outputs scan signals according to a set of phase-complementary clock signals CK6/XCK6, the shift register 470 outputs scan signals according to a set of phase-complementary clock signals CK7/XCK7, and the shift register 480 outputs scan signals according to a set of phase-complementary clock signals CK8/XCK8. The shift registers may respectively include multiple shift register circuits 411, for outputting scan signals G(n).

Figure 16:
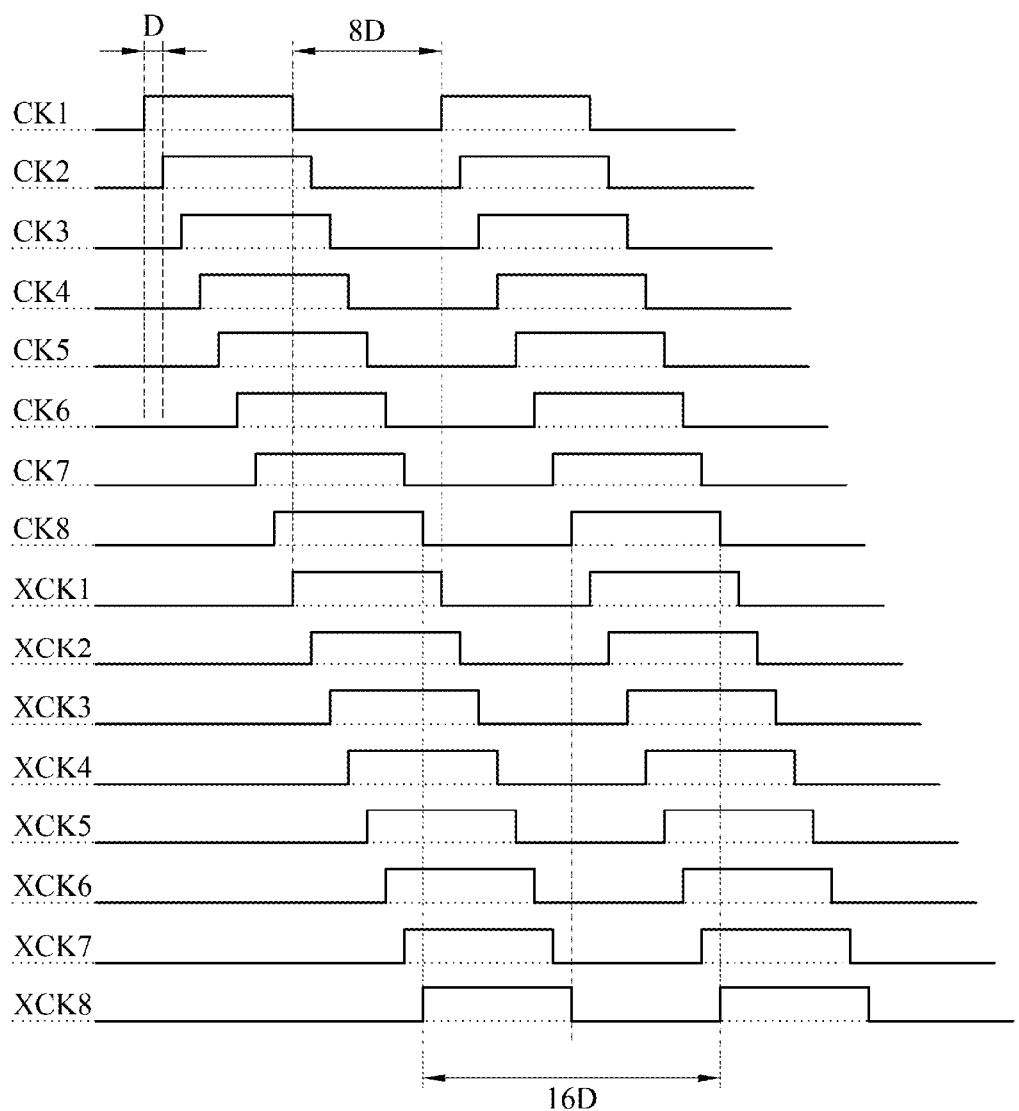
FIG. 16 shows a schematic waveform diagram of clock signals according to the fourth embodiment of the present disclosure.

FIG. 16 shows a schematic waveform diagram of clock signals according to the fourth embodiment of the present disclosure. The clock signals CK1/CK2/CK3/CK4/CK5/CK6/CK7/CK8/XCK1/XCK2/XCK3/XCK4/XCK5/XCK6/XCK7/XCK8 may be periodic signals that have one delay D in the above-mentioned order and a period of 16×D, and the number of the clock signals is 16.

For example, the shift register 410 alternately outputs, according to the clock signals CK1/XCK1, the scan signals G(1), G(9), G(17), G(25), and so on; the shift register 420 alternately outputs, according to the clock signals CK2/XCK2, the scan signals G(2), G(10), G(18), G(26), and so on; the shift register 430 alternately outputs, according to the clock signals CK3/XCK3, the scan signals G(3), G(11), G(19), G(27), and so on; the shift register 440 alternately outputs, according to the clock signals CK4/XCK4, the scan signals G(4), G(12), G(20), G(28), and so on; the shift register 450 alternately outputs, according to the clock signals CK5/XCK5, the scan signals G(5), G(13), G(21), G(29), and so on; the shift register 460 alternately outputs, according to the clock signals CK6/XCK6, the scan signals G(6), G(14), G(22), G(30), and so on; the shift register 470 alternately outputs, according to the clock signals CK7/XCK7, the scan signals G(7), G(15), G(23), G(31), and so on; the shift register 480 alternately outputs, according to the clock signals CK8/XCK8, the scan signals G(8), G(16), G(24), G(32), and so on.

Figure 17:
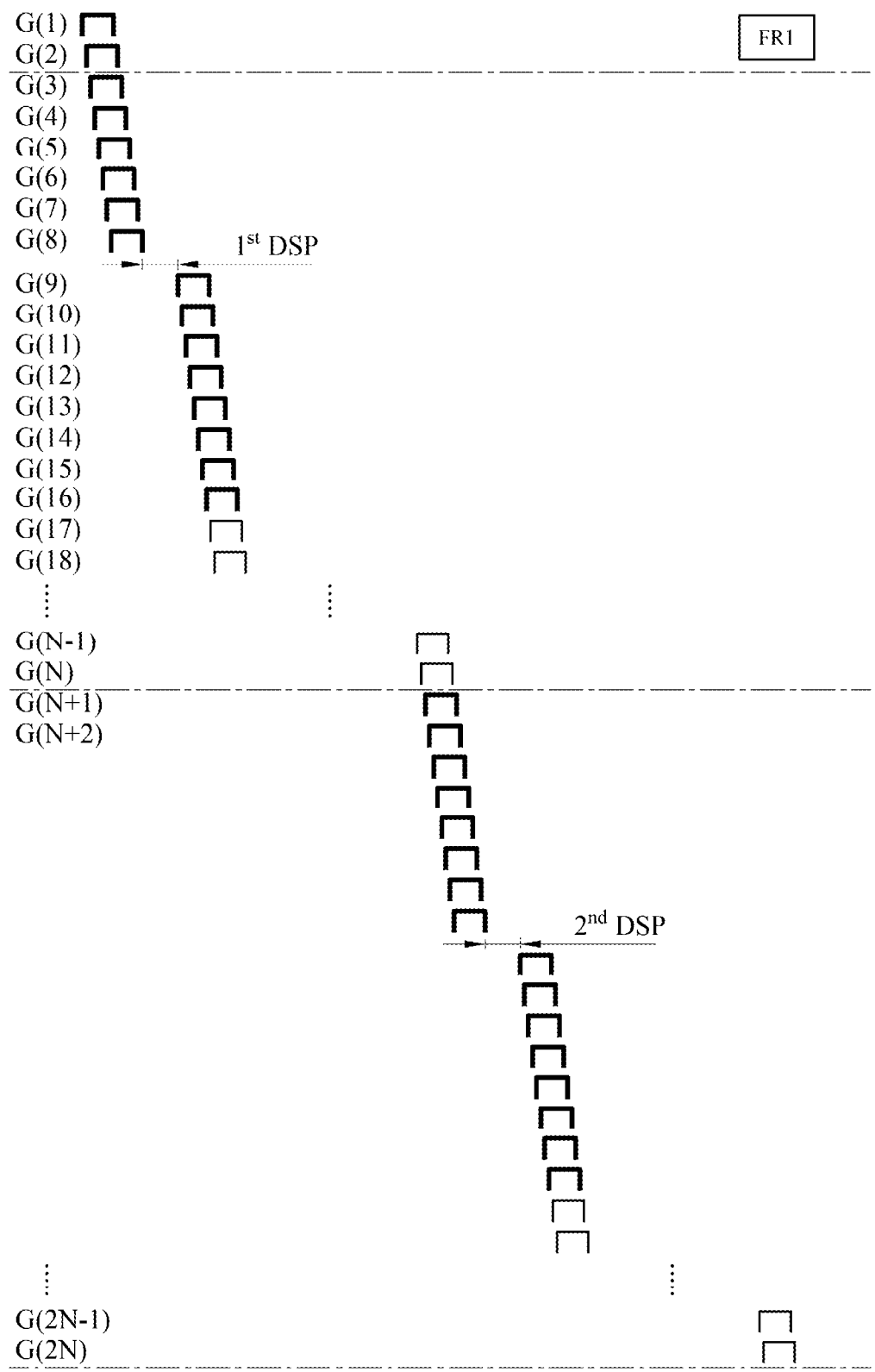
FIG. 17 shows a schematic timing diagram of scan signals according to the fourth embodiment of the present disclosure.

Referring to FIG. 17 in combination with FIGS. 15 and 16, FIG. 17 shows a schematic timing diagram of scan signals during the frame period FR1 according to the fourth embodiment of the present disclosure. During the frame period FR1, when the display stop period DSP occurs between the enable periods of the scan lines of the scan signal G(8) and the scan signal G(9), the clock signals provided to the scan driver 400 are all disabled. However, since the shift register circuits 411 of the 1$^{st}$-stage to the 16$^{th}$-stage are enabled by the previous-stage scan signals, the driving nodes Q of those stages are all maintained at the high voltage level during the display stop period DSP, thus stressing the driving element. Therefore, according to one embodiment of the present disclosure, the time position of the display stop period DSP may be changed according to the number of the clock signals during different frame periods. As such, the display stop period DSP of the frame period FR2 may occur between the enable periods of the scan lines of the scan signal G(24) and the scan signal G(25), the display stop period DSP of the frame period FR3 may occur between the enable periods of the scan lines of the scan signal G(40) and the scan signal G(41), and so on, which are not further described here.

Each of the frame periods in the fourth embodiment of the present disclosure further includes two sub-frame periods SF1-SF2; namely, each frame period may have a display stop periods DSP. The remaining features are the same as those of the previous embodiments, and are not further described.

Furthermore, in another embodiment of the present disclosure, the multiple display stop periods DSP in one frame period may serve as touch sensing periods during which the touch driver 500 outputs sensing signals S(1)-S(N) for driving the touch panel 620. The sensing signals S(1)-S(N) may be driven in a time-divisional and block-divisional manner during the multiple display stop periods DSP, or the sensing signals S(1)-S(N) may be driven during the summation of the multiple display stop periods DSP. However, the present disclosure is not limited thereto.

Figure 18:
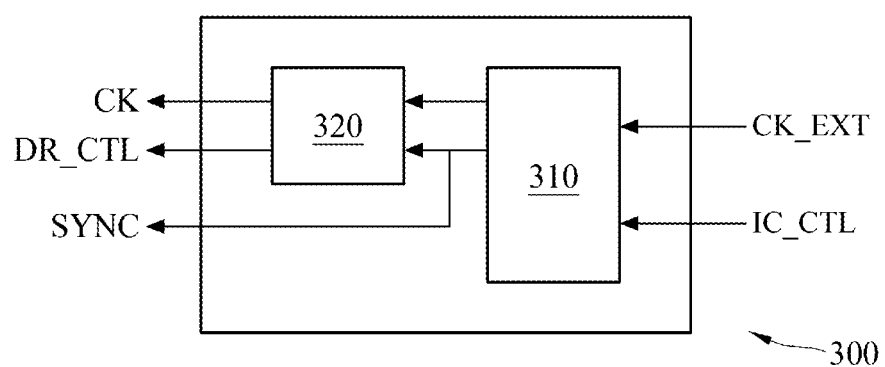
FIG. 18 shows a function block diagram of a timing controller according to one embodiment of the present disclosure.

Referring to FIG. 18, in another embodiment of the present disclosure, a timing controller 300 for achieving the driving method of the present disclosure is further provided. FIG. 18 shows a function block diagram of the timing controller according to one embodiment of the present disclosure. The timing controller 300 includes a processing unit 310 and a cycling stop unit 320. The processing unit 310 receives an external control signal IC_CTL and an external clock signal CK_EXT from a motherboard (not shown). The processing unit 310 determines the initiation time of each frame period and outputs a synchronization signal SYNC and K clock signals. Additionally, the cycling stop unit 320 may include a counter (not shown). The counter counts current frame periods according to the synchronization signal SYNC, and periodically adjusts the initiation time positions of the display stop periods DSP of the multiple consecutive frame periods according to the number of the clock signals. An offset of the display stop periods DSP of neighboring frame periods is K enable periods of the scan lines. A direction of the offset may be the same as or opposite the scanning direction; however, the present disclosure is not limited thereto. The display stop periods DSP of different frame periods FR may have the same length or different lengths, and the present disclosure is not limited thereto.

The present disclosure also provides a mobile apparatus adapted for use in the driving method for scan signals of the present disclosure, for example, a touch display apparatus, a photo-sensing display apparatus, a fingerprint-recognizing display apparatus, or the like. The driving method of the present disclosure can be applied to any mobile apparatus in which when the scan driver 400 receives an instruction to disable clock signals, the display stop period DSP begins and the outputting of the scan signal G(n) to the display panel 610 is stopped, and the time position of the display stop period DSP is moved, with the number of the clock signals as a unit, periodically for the plurality of frames period, thereby preventing long-time stressing of the driving elements in the scan driver 400 from reducing reliability of the driving elements, and thus improving the display quality.

To sum up, according to the driving method for scan signals provided by the present disclosure, when a mobile apparatus receives an instruction to disable the clock signals, a display stop period begins and no scan signal is outputted to the display panel. The time position of the display stop period is moved, with the number of the clock signals as a unit, periodically for the plurality of frames period, so as to avoid stressing the driving elements of the scan driver for a long time which consequently reduces reliability of the driving elements, thereby improving the display quality.

While the present invention has been disclosed above with the embodiments, these embodiments are not intended to limit the present invention. All alterations and modifications fall within the scope of the invention, without departing from the spirit and scope of the invention. Regarding the scope of patent protection as defined by the scope of the present invention, refer to the appended claims.

What is claimed is:

1. An apparatus, comprising:
    a display panel including a plurality of scan lines, each of scan lines has an enable period;
    a timing controller configured to output K clock signals and a driving control signal, to control outputting a plurality of images respectively during a plurality of consecutive frame periods, and to display the images during enable periods of the scan lines, wherein the frame periods respectively comprise at least one sub-frame period, the sub-frame period includes enable periods of the scan lines and a display stop period, the display stop period is between two neighboring enable periods of the scan lines, the display stop period and the enable periods of the scan lines have no overlapping interval, the K clock signals sequentially have a delay, and each of the K clock signals is a periodic signal with K delays as one period, and the timing controller being configured to:
        output the driving control signal and the clock signals during the display stop period of the at least one sub-frame period of each of the frame periods;
        determine the display stop period of the at least one sub-frame period of a first frame period to occur between an $n^{th}$ scan line's enable period and an $(n+1)^{th}$ scan line's enable period; and
        determine the display stop period of the at least one sub-frame period of a $Z^{th}$ frame period to occur between an enable period of an $(n+Z \times K)^{th}$ scan line and an enable period of an $(n+Z \times K+1)^{th}$ scan line, wherein the frame periods do not overlap with each other, and the $(n+Z \times K)^{th}$ scan line and the $(n+Z \times K+1)^{th}$ scan line are disposed next to each other, Z is an integer, n, N, and K are positive integers, n is smaller than N, N is greater than K, and $(n+Z \times K+1)$ is not greater than N; and
    a scan driver electrically connected to the display panel and the timing controller and configured to receive the driving control signal and the clock signals, wherein a plurality of scan signals are sequentially outputted to the scan lines according to the clock signals during the enable periods of the scan lines, and driving of the scan driver is stopped during the display stop period, wherein the enable periods of the scan lines have no overlapping interval.

2. The apparatus of claim 1, wherein the clock signals are sequentially and periodically provided to the scan driver according to the delay, and the clock signals comprise:
    a first clock signal; and
    a second clock signal, wherein the first clock signal is adjacent to and enabled prior to the second clock signal.

3. The apparatus of claim 2, wherein during the enable period of the $n^{th}$ scan line, the scan driver outputs an $n^{th}$ scan signal to an $n^{th}$ scan line according to the first clock signal, and during the enable period of the $(n+1)^{th}$ scan line, the scan driver outputs an $(n+1)^{th}$ scan signal to an $(n+1)^{th}$ scan line according to the second clock signal.

4. The apparatus of claim 2, wherein during the enable period of the $(n+Z \times K)^{th}$ scan line, the scan driver outputs an $(n+Z \times K)^{th}$ scan signal to the $(n+Z \times K)^{th}$ scan line according to the first clock signal, and during the enable period of the $(n+Z \times K+1)^{th}$ scan line, the scan driver outputs an $(n+Z \times K+1)^{th}$ scan signal to the $(n+Z \times K+1)^{th}$ scan line according to the second clock signal.

5. The apparatus of claim 1, wherein timings of a first sub-frame period and a second sub-frame are not interlaced with each other.

6. The apparatus of claim 1, wherein the timing controller is further configured to:
    determine the display stop period of each of the at least one sub-frame period of a second frame period to occur between an enable period of an $(n+K)^{th}$ scan line and an enable period of an $(n+K+1)^{th}$ scan line, wherein the second frame period is immediately next to the first frame period.

7. The apparatus of claim 6, wherein the second frame period is next to and occurs after the first frame period.

8. The apparatus of claim 1, wherein the timing controller comprises:
    a cycling stop unit configured to determine a time position at which the display stop period occurs according to a number of the frame periods, and the cycling stop unit comprising:
        a counter, for counting the number of the frame periods according to a synchronization signal, wherein when the number of the frame periods is Z, the display stop period of a $Z^{th}$ frame period occurs between an $(n+Z \times K)^{th}$ scan signal and an $(n+Z \times K+1)^{th}$ scan signal, and the synchronization signal is a pulse signal enabled before each of the frame periods starts.

9. The apparatus of claim 1, wherein the scan driver comprises:
    at least one shift register configured to sequentially and alternately output a corresponding scan signals respectively according to the K clock signals, and comprising a plurality of shift register circuits, wherein each of the shift register circuits comprises:
        an input end electrically connected to corresponding clock signal lines to receive the clock signals respectively; and
        an output end, for outputting the scan signals to the corresponding scan lines according to the K clock signals.

10. The apparatus of claim 9, wherein each of the shift register circuits further comprises:
    a reset end configured to receive the driving control signal to reset each of the shift register circuits.

11. A driving method for scan signals, adapted for a scan driver for sequentially outputting, during a plurality of consecutive frame periods, a plurality of scan signals to corresponding scan lines respectively during a plurality of enable periods of scan lines, the method comprising:
    alternately and sequentially providing K clock signals to the scan driver during each of the consecutive frame periods, and sequentially enabling, during the enable periods of the scan lines, the scan signals to the corresponding scan lines according to the K clock signals, wherein the K clock signals sequentially have a delay, and each of the K clock signals is a periodic signal with K delays as one period;

including, in each of the frame periods, a sub-frame period comprising enable periods of N scan lines and a display stop period, wherein the scan signals are not outputted during the display stop period, and the display stop period occurs between two neighboring enable periods of the scan lines, and the display stop period and the enable periods of the scan lines have no overlapping interval;

the display stop period occurring between the enable period of an $n^{th}$ scan line and an enable period of an $(n+1)^{th}$ scan line during the sub-frame period of a first frame period; and during the sub-frame period of a $Z^{th}$ frame period, the display stop period occurring between an enable period of an $(n+Z \times K)^{th}$ scan line and an enable period of an $(n+Z \times K+1)^{th}$ scan line, wherein the frame periods do not overlap with each other, Z is an integer, n, N, and K are positive integers, n is smaller than N, N is greater than K, and $(n+Z \times K+1)$ is not greater than N.

12. The method of claim 11, further comprising:
a plurality of sub-frame periods, each of the sub-frame periods including the enable periods of N scan lines and a display stop period.

13. The method of claim 11, wherein Z is an integer not greater than (N/K).

14. The method of claim 11, wherein the $n^{th}$ scan line and the $(n+1)^{th}$ scan line are disposed next to each other, and the $(n+Z \times K)^{th}$ scan line and the $(n+Z \times K+1)^{th}$ scan line are disposed next to each other.

15. The method according to claim 11, wherein the providing of the K clock signals to the scan driver is stopped during the display stop period.

16. The method of claim 11, further comprising:
outputting, during the enable period of the $n^{th}$ scan line, an $n^{th}$ scan signal according to a first clock signal, and outputting, during the enable period of the $(n+1)^{th}$ scan line, an $(n+1)^{th}$ scan signal according to a second clock signal; and
outputting, during the enable period of the $(n+Z \times K)^{th}$ scan line, an $(n+Z \times K)^{th}$ scan signal according to the first clock signal, and outputting, during the enable period of the $(n+Z \times K+1)^{th}$ scan line, an $(n+Z \times K+1)^{th}$ scan signal according to the second clock signal, wherein the first clock signal is adjacent to and enabled prior to the second clock signal.

17. The method of claim 11, further comprising: outputting, during the display stop period of each of the consecutive frame periods, a driving control signal to the scan driver.

18. The method of claim 17, further comprising: providing the driving control signal to a touch driver, such that the touch driver generates a plurality of sensing signals during the display stop period to perform a touch sensing function.

19. The method of claim 11, wherein (Z−2) frame periods are between the $Z^{th}$ frame period and the first frame period.

20. A driving method for scan signals, adapted for a scan driver for sequentially outputting N scan signals to N scan lines during enable periods of the N scan lines of a plurality of consecutive frame periods, the method comprising:
alternately and sequentially providing K clock signals to the scan driver during each of the consecutive frame periods, and sequentially enabling, during the enable periods of the scan lines, the scan signals to a corresponding scan lines according to the K clock signals, wherein the K clock signals sequentially have a delay, and each of the K clock signals is a periodic signal with K delays as one period;

including a display stop period in each of the consecutive frame periods, the display stop period occurring between two neighboring enable periods of the scan lines, wherein the providing of the K clock signals to the scan driver is stopped during the display stop period to not enable the scan signals, and the display stop period and the enable periods of the scan lines have no overlapping interval;

the display stop period of a first frame period occurring between an enable period of an $n^{th}$ scan line and an enable period of an $(n+1)^{th}$ scan line, wherein the $n^{th}$ scan line and the $(n+1)^{th}$ scan line are disposed next to each other; and the display stop period of a $Z^{th}$ frame period occurring between an enable period of an $(n+Z \times K)^{th}$ scan line and an enable period of an $(n+Z \times K+1)^{th}$ scan line, wherein the $(n+Z \times K)^{th}$ scan line and the $(n+Z \times K+1)^{th}$ scan line are disposed next to each other, the consecutive frame periods have no overlapping or interlacing interval, Z is an integer, n, N, and K are positive integers, n is smaller than N, N is greater than K, and $(n+Z \times K+1)$ is not greater than N.

21. The method of claim 20, wherein Z is not greater than (N/K).

22. The method of claim 20, further comprising:
outputting, during the enable period of the $n^{th}$ scan line, an $n^{th}$ scan signal according to a first clock signal, and outputting, during the enable period of the $(n+1)^{th}$ scan line, an $(n+1)^{th}$ scan signal according to a second clock signal; and
outputting, during the enable period of the $(n+Z \times K)^{th}$ scan line, an $(n+Z \times K)^{th}$ scan signal according to the first clock signal, and outputting, during the enable period of the $(n+Z \times K+1)^{th}$ scan line, an $(n+Z \times K+1)^{th}$ scan signal according to the second clock signal, wherein the first clock signal is adjacent to and enabled prior to the second clock signal.

23. The method of claim 20, further comprising:
outputting, during the display stop period of each of the consecutive frame periods, a driving control signal to the scan driver.

24. The method of claim 23, wherein the driving control signal is enabled during the display stop period and has a fixed voltage level.

25. The method of claim 23, wherein the driving control signal comprises:
a touch initiation signal at initiation of the display stop period, being a pulse signal having an enable voltage level; and
a touch termination signal at termination of the display stop period, being a pulse signal having an enable voltage level.

* * * * *